US012601758B2

(12) United States Patent
Molina

(10) Patent No.: US 12,601,758 B2
(45) Date of Patent: Apr. 14, 2026

(54) SOCKETED PROBES

(71) Applicant: Translarity, Inc., Fremont, CA (US)

(72) Inventor: Raul Molina, Austin, TX (US)

( * ) Notice: Subject to any disclaimer, the term of this patent is extended or adjusted under 35 U.S.C. 154(b) by 166 days.

(21) Appl. No.: 18/223,698

(22) Filed: Jul. 19, 2023

(65) Prior Publication Data

US 2024/0125815 A1    Apr. 18, 2024

Related U.S. Application Data

(63) Continuation of application No. 17/967,857, filed on Oct. 17, 2022, now abandoned.

(51) Int. Cl.
*G01R 1/067*        (2006.01)

(52) U.S. Cl.
CPC ..... *G01R 1/06727* (2013.01); *G01R 1/06722* (2013.01)

(58) Field of Classification Search
CPC ...... G01R 1/06722; G01R 1/06; G01R 1/067; G01R 1/06705; G01R 1/06711; G01R 1/06716; G01R 1/06727; G01R 1/06733; G01R 1/06738; G01R 1/06744; G01R 1/0675; G01R 1/06755; G01R 1/06761; G01R 1/06766; G01R 1/06772; G01R 1/06777; G01R 1/073; G01R 1/07307; G01R 1/07314; G01R 1/07321; G01R 1/07328; G01R 1/07335; G01R 1/07342; G01R 1/0735; G01R 1/07357; G01R 1/07364; G01R 1/07371; G01R 1/07378; G01R 1/07385; G01R 1/07392; G01R 1/0466; G01R 1/36; G01R 1/045;

(Continued)

(56) References Cited

U.S. PATENT DOCUMENTS 6,350,137 B1 *    2/2002    Shimada .............. H05K 7/1023
                                                                              439/70
2007/0216433 A1 *   9/2007    Miura ................ G01R 1/06727
                                                                              324/755.07

(Continued)

FOREIGN PATENT DOCUMENTS

KR           102042923 B1 *  11/2019  ......... G01R 31/2808
KR           20220106443 A  *  7/2022  ............... G01R 1/04

OTHER PUBLICATIONS

Kim Soo Yong, "Probe Device of Instrument", Jul. 29, 2022 (Year: 2022).*
Machine translation of KR-102042923-B1 (Year: 2019).*

*Primary Examiner* — Lee E Rodak
*Assistant Examiner* — Jeremiah J Barron
(74) *Attorney, Agent, or Firm* — Shapiro IP Law; Joseph Shapiro

(57)                 ABSTRACT

A modular/configurable space transformer system may comprise socketed probes, an upper guide plate, a lower guide plate, and a spacer. A socketed probe may comprise an upper support arm with positioning tabs for insertion into slots in the upper guide plate, as well as a PCB contact point for making a conductive connection with a PCB pad. The socketed probe may additionally comprise a lower support arm with a positioning tab for insertion into a slot in an upper guide plate, as well as a DUT (device under testing) contact point for making a conductive connection with a DUT pad. The spacer may separate the upper guide plate and lower guide plate.

20 Claims, 20 Drawing Sheets

(58) Field of Classification Search
  CPC .... G01R 1/0483; G01R 3/00; G01R 31/2601;
          G01R 31/2844; G01R 31/2886; G01R
          31/2863; G01R 31/2889; G01R 35/00
  See application file for complete search history.

(56)                    References Cited

U.S. PATENT DOCUMENTS

| | | | |
|---|---|---|---|
| 2014/0327461 A1* | 11/2014 | Fan .................... | G01R 1/07371 |
| | | | 324/750.25 |
| 2018/0299489 A1* | 10/2018 | Yoshioka ........... | G01R 1/07314 |
| 2020/0348337 A1* | 11/2020 | Vettori .............. | G01R 1/07342 |
| 2023/0029150 A1* | 1/2023 | Crippa .............. | G01R 1/06738 |
| 2024/0027495 A1* | 1/2024 | Vettori .............. | G01R 1/06738 |

* cited by examiner

SOCKETED PROBES

CROSS REFERENCE TO CORRELATED APPLICATIONS

This application is a continuation-in-part of U.S. patent application Ser. No. 17/967,857, titled "Socketed Probes," filed on Oct. 17, 2022, the first inventor of which is Raul Molina, and which is incorporated herein by reference in its entirety.

BACKGROUND OF THE INVENTION

A space transformer is used in integrated circuit testing as an adapter or transition between the spatially dense test pads on a device under testing (DUT) and the less dense probe pads on the testing printed circuit board (PCB). In informal terms, a space transformer "fans" out the spatially dense test outputs from the DUT into a manageable and less spatially dense set of test pads for input into a testing PCB. Or, in other words, a space transformer translates wafer-level pad pitch and feature dimensions to a larger pad pitch and/or feature dimensions-usually that of a testing PCB.

One of the problems with space transformers is that they can be expensive to design and manufacture, often requiring a customized solution for each DUT and/or PCB.

What is needed is a space translator solution that is less expensive, more modular, and more adaptable.

BRIEF SUMMARY OF THE INVENTION

A modular/configurable space transformer system may comprise socketed probes, an upper guide plate, a lower guide plate, and a spacer. A socketed probe may comprise an upper support arm with positioning tabs for insertion into slots in the upper guide plate, as well as a PCB contact point for making a conductive connection with a PCB pad. The socketed probe may additionally comprise a lower support arm with a positioning tab for insertion into a slot in an upper guide plate, as well as a DUT (device under testing) contact point for making a conductive connection with a DUT pad. The spacer may separate the upper guide plate and lower guide plate.

DETAILED DESCRIPTION OF THE INVENTION

Figure 1:
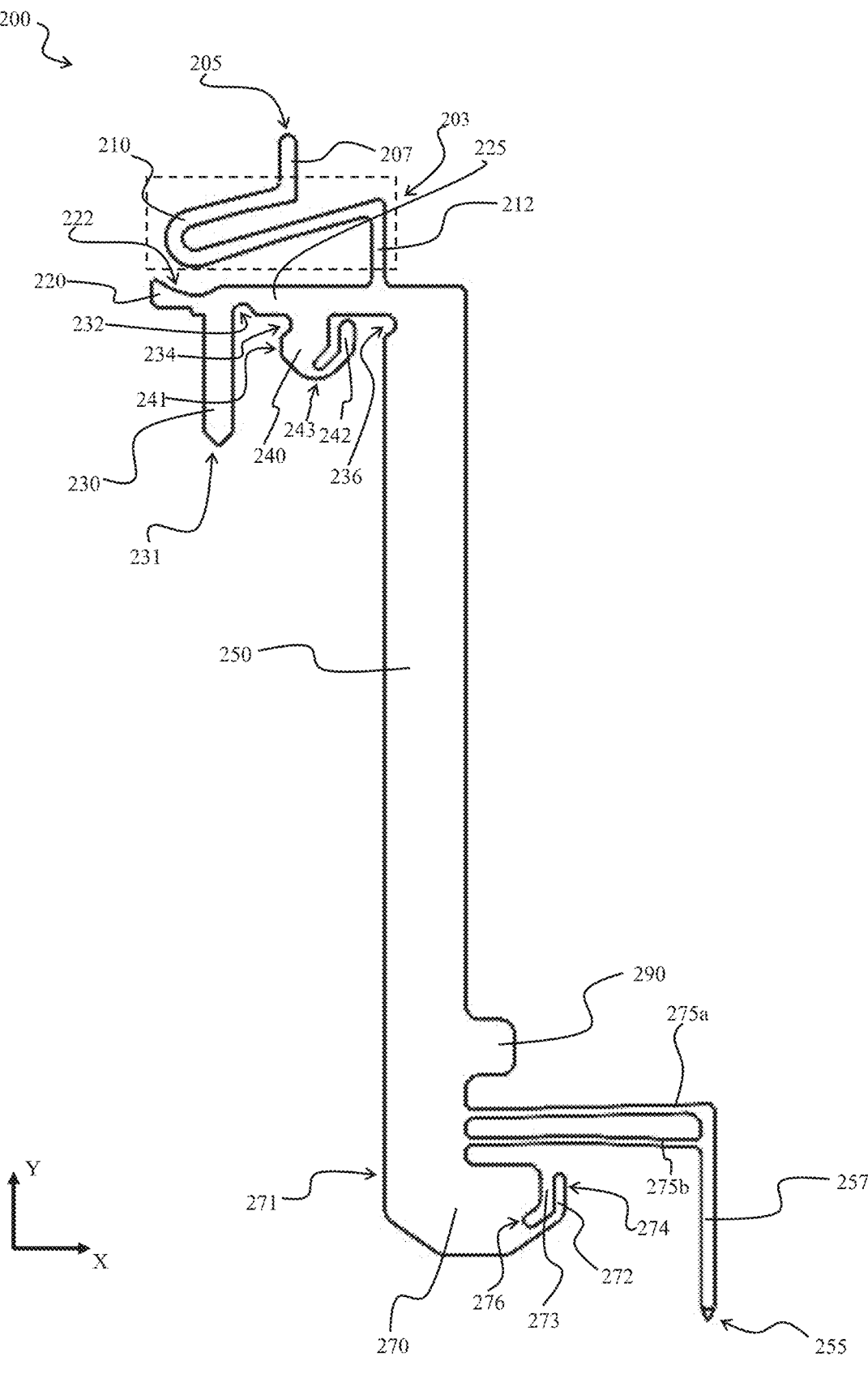
FIG. 1 is a side view of an exemplary socketed probe.

A system and method are disclosed for a socketed probe and for a modular and adaptable space transformer system. Table of Reference Numbers from Drawings:

The following table is for convenience only and should not be construed to supersede any potentially inconsistent disclosure herein.

| Reference Number | Description |
| --- | --- |
| 100 | space transformer system |
| 110 | upper guide plate |
| 112a-n | slots in upper guide plate 110 for rough positioning tab 230 |
| 114a-n | slots in upper guide plate 110 for fine positioning tab 240 |
| 115a-n | Positioning walls in slots 114a-n |
| 120 | lower guide plate |
| 122a-n | slots in lower guide plate 120 for lower fine-positioning tab 270 |
| 130 | spacer |
| 200 | socketed probe |
| 203 | Cantilever spring arm assembly |
| 205 | PCB contact |
| 207 | PCB contact point arm |
| 210 | PCB cantilever spring arm |
| 212 | PCB contact support arm |
| 222 | spring-bend cutout |
| 220 | Upper handling tab |
| 225 | Upper horizontal support arm |
| 230 | rough positioning tab |
| 231 | Pointed/tapered end of rough |

-continued

| Reference Number | Description |
|---|---|
| | positioning tab |
| 232 | Corner cutout |
| 234 | Corner cutout |
| 236 | Corner cutout |
| 240 | Fine positioning tab |
| 241 | position-set edge of fine positioning tab 240 |
| 242 | fine position spring arm |
| 243 | Spring arm inflection point |
| 244 | Compression spacing |
| 250 | Connector arm |
| 255 | DUT contact |
| 257 | DUT contact point arm |
| 270 | Lower fine-positioning tab |
| 271 | position-set edge of lower fine positioning tab 270 |
| 272 | Lower fine-positioning spring arm |
| 273 | Compression space |
| 274 | Spring arm contact edge |
| 275a-b | Lower horizontal support arm |
| 276 | Spring arm inflection point |
| 290 | Lower handling tab |
| 300a-n | socketed probes |
| 330a-n | Rough positioning tabs for socketed probes 300a-n, respectively |
| 340a-n | Fine positioning tabs for socketed probes 300a-n, respectively |
| 600 | testing PCB |
| 610a-n | testing PCB pads |
| 700 | device under testing ("DUT") |
| 710a-n | DUT pads |
| 1601 | A width measurement of PCB cantilever spring arm |
| 1602 | A width measurement of PCB cantilever spring arm |
| 1603 | A width measurement of PCB contact support arm |
| 1604 | A width measurement of PCB contact point arm |
| 1605 | A height measurement of PCB cantilever spring arm |
| 1606 | A height measurement of upper horizontal support arm |
| 1607 | A height measurement of upper fine positioning tab |
| 1608 | A width measurement of upper fine positioning tab |
| 1609 | A width measurement of upper rough positioning tab |
| 1610 | A height measurement of upper rough positioning tab |
| 1611 | A height measurement of PCB cantilever spring arm |
| 1701 | A width measurement of lower handling tab |
| 1702 | A height measurement of lower handling tab |
| 1703 | A height measurement of a lower horizontal support arm |
| 1704 | A height measurement of a lower horizontal support arm |
| 1705 | A width measurement of DUT contact point arm |
| 1706 | A width measurement of the edge of the lower rough positioning tab to the DUT contact point arm edge |
| 1707 | A width measurement of the lower rough positioning tab |
| 1708 | A width measurement of the lower fine positioning spring arm |
| 1709 | A width measurement of the lower fine positioning tab |
| 1710 | A height measurement of the lower positing tab |
| 1711 | An angle measurement of the top of the lower horizontal support arm to the DUT contact point arm |
| 1800a-n | Socketed probes with varying horizontal offsets |

As shown in FIGS. 3 and 5-15, a space transformer system 100 may comprise an upper guide plate 110, lower guide plate 120, and at least one socketed probe 200. FIGS. 1-3 and 16-19 reference and illustrate a single socketed probe 200. FIGS. 5-15 and 20 reference and illustrate a set of socketed probes 300a-n within a testing system. A testing printed circuit board ("PCB") 600 and device under testing ("DUT") 700 are also shown in some of FIGS. 3, 5-15, 19, and 20.

Figure 2:
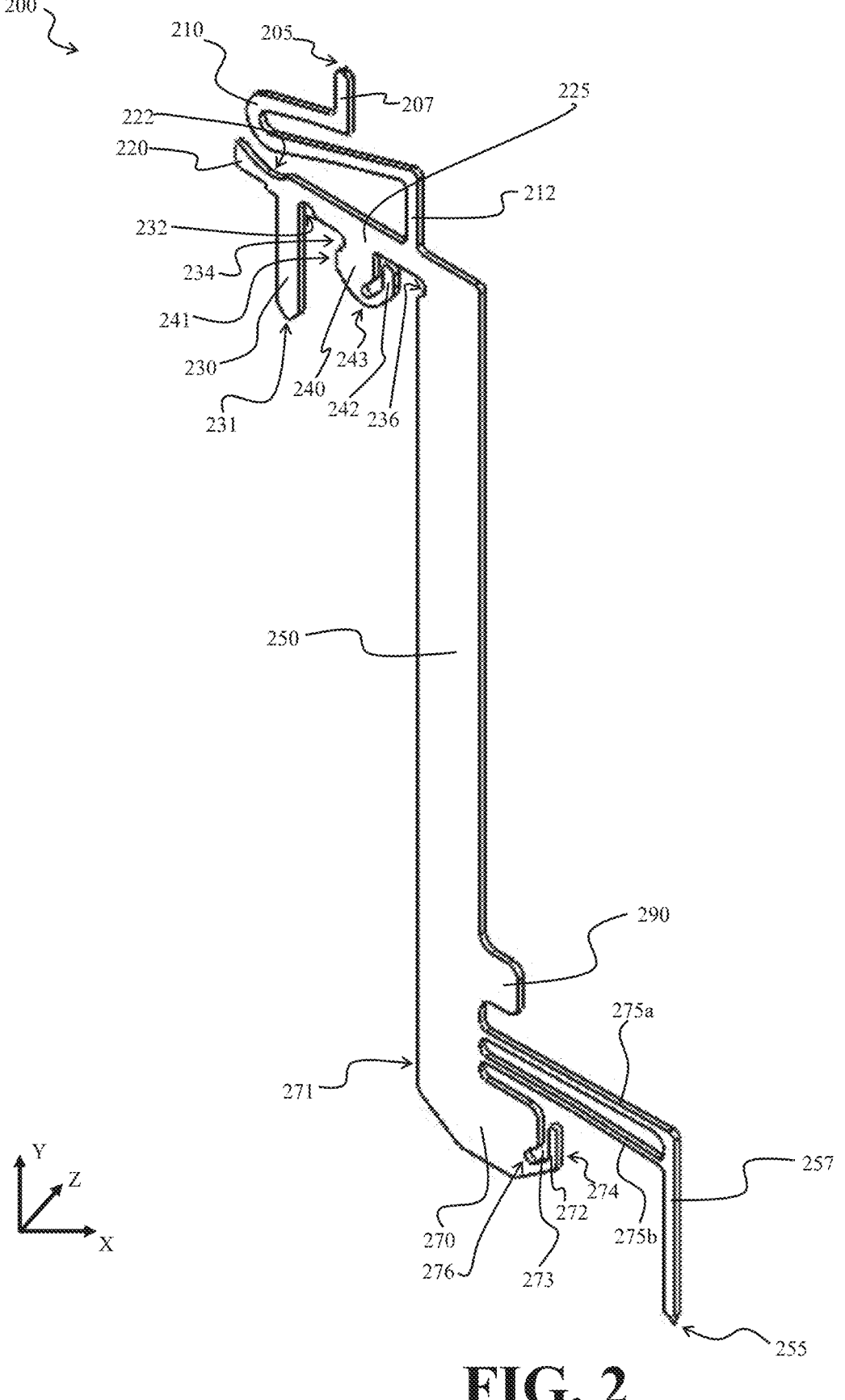
FIG. 2 is an elevated-angle view of an exemplary socketed probe.
Figure 3:
FIG. 3 is a side view of an exemplary socketed probe, along with PCB, upper guide plate, spacer, lower guide plate, and DUT.

As shown in detail FIGS. 1-3, a socketed probe 200 may have several features. FIG. 1 shows a side view of an exemplary socketed probe 200. FIG. 2 shows an elevated-angle perspective of an exemplary socketed probe 200. FIG. 3 shows a side view of an exemplary socketed probe 200, along with PCB 600, upper guide plate 110, spacer 130, lower guide plate 120, and DUT 700.

Upper Assembly

As shown at least in FIGS. 1-3, 16, and 18A-C upper horizontal support arm 225 may be an arm extending horizontally from connector arm 250 to support PCB contact support arm 212 (which supports PCB cantilever spring arm 210 and PCB contact point arm 207), fine positioning tab 240, rough positioning tab 230, and handling tab 220.

In one embodiment, horizontal arm 225 may have the geometry as shown in FIG. 1. The dimensions of horizontal arm 225 may be adjusted based on the dimensionss of space transformer system 100, other components of space transformer system 100, problem domain parameters (e.g., size of DUT, size of PCB, etc.), or other factors. In one embodiment, horizontal arm 225 may have sufficient height to maintain sufficient y-dimension rigidity; and sufficient extension from connector arm 250 to provide a connection point for PCB contact support arm 212, fine positioning tab 240, rough positioning tab 230, and handling tab 220.

The purpose/function of spring arm assembly 203 (components 205, 207, 210, and 212) is to provide a contact point for testing PCB pad 610 that is able to move in the y-dimension (i.e., up and down as shown in FIGS. 1 and 3), exert upward pressure toward testing PCB pad 610 to maintain contact with testing PCB pad 610, and minimize movement in the x-dimension (i.e., left and right as shown in FIGS. 1 and 3) so that PCB contact point 205 maintains contact with testing PCB pad 610. The length of PCB contact support arm 212 may be modified based on the characteristics of a particular application. In general, support arm 212 may be sufficiently long/high so that PCB cantilever spring arm 210, when flexed downward toward upper horizontal support arm 225, does not come in contact with upper horizontal support arm 225. Although such contact would likely not compromise the conductivity characteristics of socketed probe 200, such contact may result in undesirable x-dimension dislocation of PCB contact 205, and may additionally prevent contact points on other socketed probes from properly contacting their respective testing PCB pads.

PCB cantilever spring arm 210 may have a curvature, angle (relative to PCB contact support arm 212), and length/dimensions designed to minimize x-dimension displacement of contact 205 when contact 205 is subject to downward (y-dimension) pressure, e.g., from interaction with testing PCB pad 610. Such downward pressure may frequently result in y-dimension displacement of contact 205. In general, the concept of a cantilever spring is known in the art. The dimensions, shape, and geometries of cantilever spring art 210 may be adjusted and/or modified without departing from the scope of this disclosure. In one embodiment, spring arm 210 may have the geometry shown in FIG. 1. In general, increasing the length of spring arm 210 may decrease the potential for x-dimension displacement from downward pressure on contact point 205. As shown in FIGS. 1 and 3, for practical reasons the curve on spring arm 210 may extend (to the left as shown in FIGS. 1 and 3) to approximately the same x location as the left edge of handling tab 220. The dimensions, shape, and geometries of cantilever spring arm assembly (comprising PCB contact support arm 212, PCB cantilever spring arm 210, PCB contact point arm 207, and PCB contact 205) may be adjusted, modified, and/or tuned to change x-dimension displacement and sensitivity characteristics, y-dimension displacement and sensitivity characteristics, and other characteristics of cantilever spring arm assembly—without departing from the scope of this disclosure.

PCB spring arm 210 may be designed so that, when compressed, i.e., when applied to testing PCB pad 610, PCB contact 210 maintains its x-position (right-left in FIGS. 1 and 3) even while its y-position (up-down in FIGS. 1 and 3) changes as a result of the compression resulting from pressure from testing PCB pad 610.

PCB contact point arm 207 may transition out of spring arm 210 in a vertical, or a substantially vertical, orientation. As described above, cantilever spring arm assembly 203 may have various dimensions, shapes, and geometries. In some embodiments, PCB contact point arm 207 may be shorter, longer, or relatively non-existent as compared to the exemplary drawings. In general, the design—including but not limited to shapes, geometries, and dimensions—of cantilever spring arm assembly 203 may have several benefits: ensuring (or decreasing the likelihood) that testing PCB 600 does not come in contact with the highest point (or any point) of PCB contact support arm 212; preventing (or decreasing the likelihood of) PCB cantilever spring arm 210 becoming horizontal (or going past horizontal) and contacting testing PCB 600 at a location other than testing PCB pad 610; providing particle tolerance robustness, i.e., increasing the minimum size of a foreign particle/debris that could be problematic if the foreign particle debris was between testing PCB 600 and PCB cantilever spring arm 210 such that it contacted both testing PCB 600 and PCB cantilever spring arm 210 and created/forced a gap that prevented PCB contact 205 from touching PCB testing pad 610. In general, height/length of PCB contact point arm 207 may depend on multiple characteristics, e.g., potential flex of spring arm 210 and resulting downward displacement of contact point 205, and anticipated distance to relative placement of testing PCB 600.

Rough positioning tab 230 may have several purposes. As shown in FIG. 2, rough positioning tab 230 may protrude downward (in the y-direction) further than fine positioning tab 240, and, when socketed probe 200 is being inserted downward into upper guide plate 110 (as described herein below), will therefore engage upper guide plate 110 before fine positioning tab 240 engages upper guide plate 110. Pointed/tapered tip 231 will facilitate easy insertion tab 230 into upper guide plate 110 (as described herein below). Even if tab 230 is slightly misaligned relative to the matching slot/hole in upper guide plate 110 in the x-dimension, pointed/tapered tip 231 will facilitate alignment as tab 230 is inserted into a slot/hole in upper guide plate 110.

Figure 15:
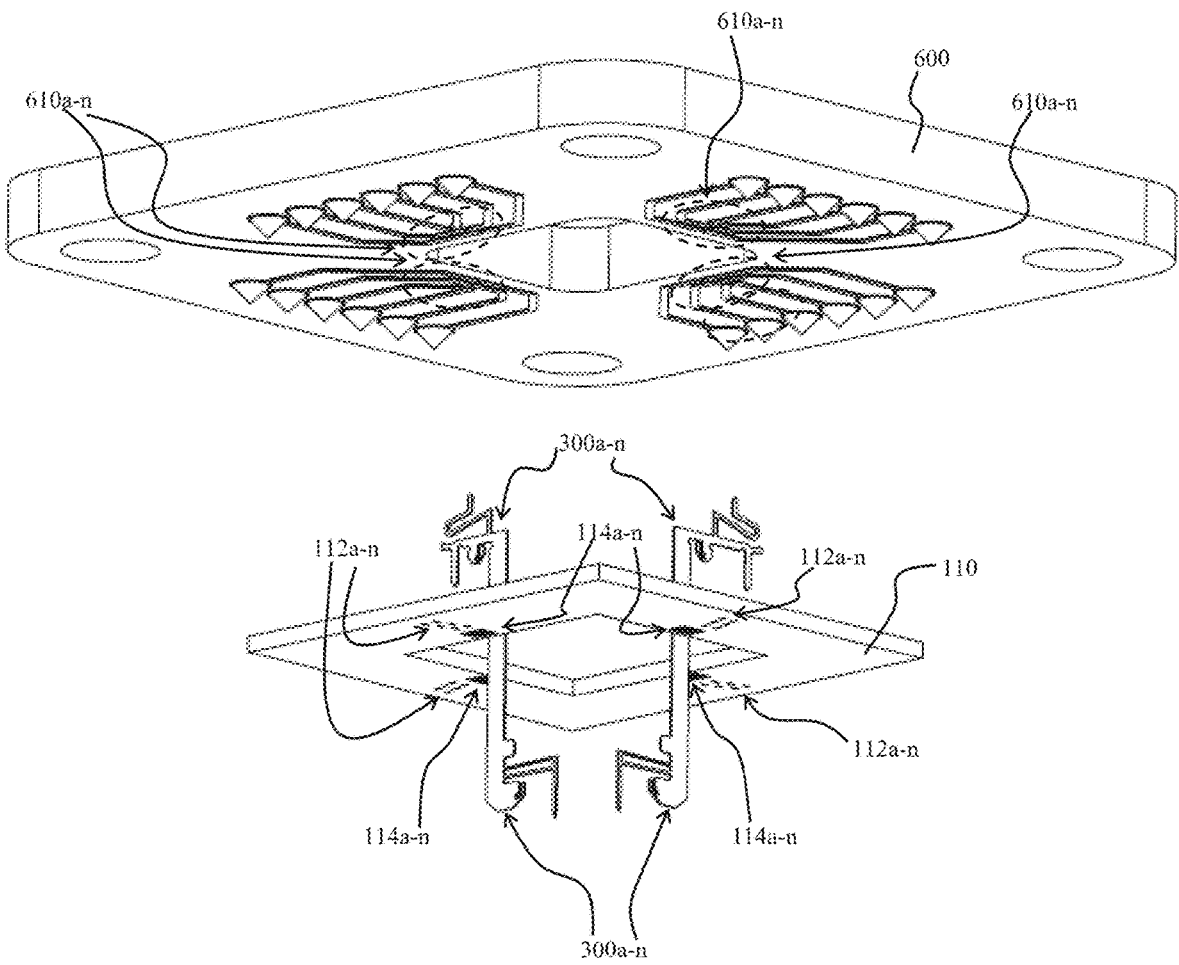
FIG. 15 is an exploded lower angle view of space transformer system 100—without the lower guide plate and DUT, and having only two socketed probes.
Figure 16:
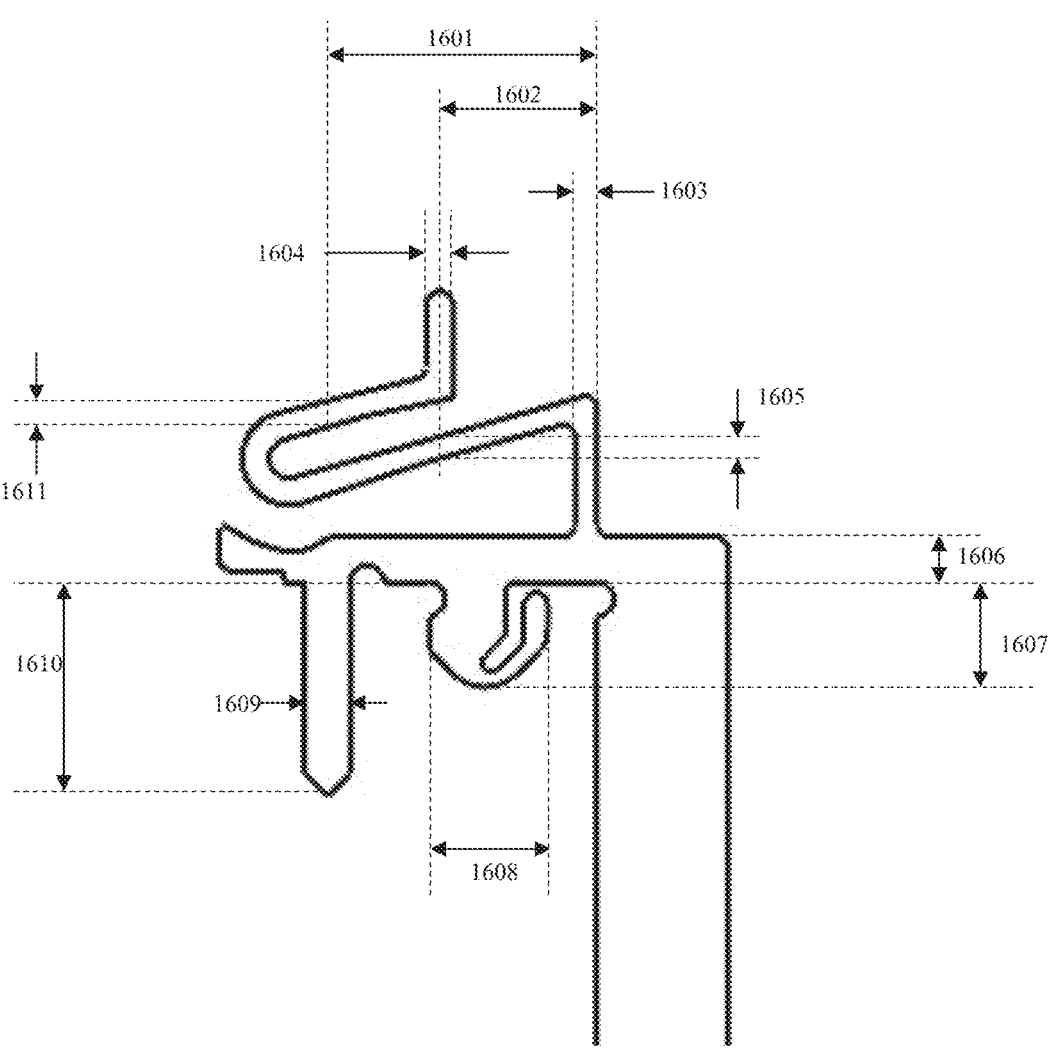
FIG. 16 is a side view of the upper end of an exemplary socketed probe having exemplary dimensions.
Figure 17:
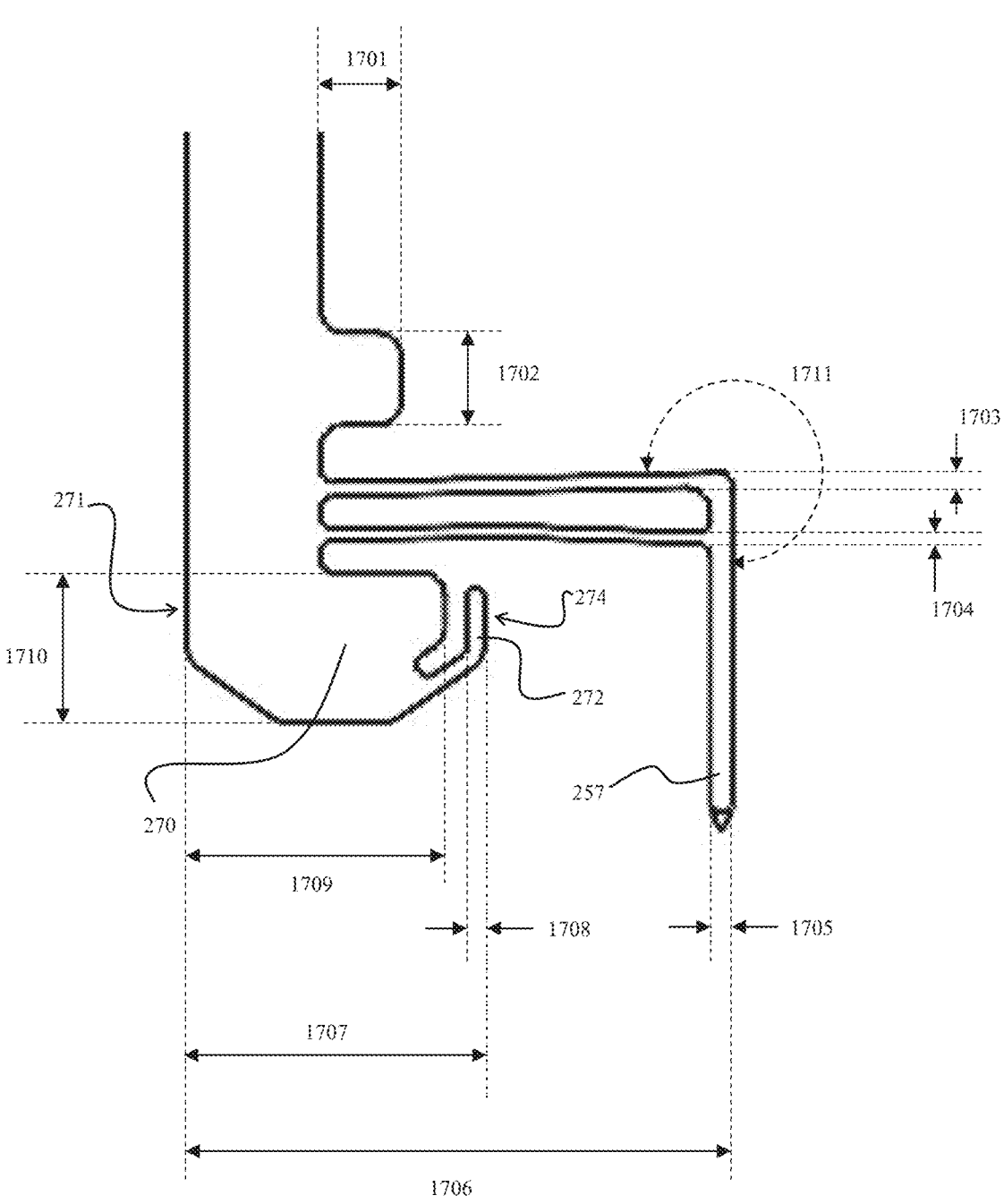
FIG. 17 is a side view of the lower end of an exemplary socketed probe having exemplary dimensions.

As shown in FIGS. 1-15, and having exemplary dimensions as shown in FIGS. 16 and 17, the heights/lengths (i.e., y-dimension length), of tabs 230, 240, and 270 may be different relative to the respective insertion points into upper guide plate 110 (for tabs 230 and 240, which are inserted in slots 112 and 114, respectively) and lower guide plate 120 (for tab 270, which is inserted in slot 122), such that the tabs are inserted into their respective slots in a distinct sequence/order. It may be beneficial to use varying slot lengths to compel/require an insertion order/sequence so that the operator or other entity, machine, or actor doing the insertion has only one target to hit at a time, and subtle movements to insert subsequent tabs will not fully or partially unseat the previously inserted tabs. Although varied tab lengths and insertion order may have the benefits described above, and/or other benefits, this feature is not strictly required or necessary.

In general, the dimensions of rough positioning tab 230 may be the same as or slightly less than the associated dimensions of complementary slots 112*a-n*, which are shown at least in FIGS. 4B, 6-7, 9-10, 13-15, and 18A-C. For example, width 1609 (FIG. 16) rough positioning tab 230 may be between 100 and 500 μm, and the thickness may be 50 μm. The corresponding dimension of slot 112 may be 3-10 μm greater than the thickness of rough positioning tab 230. So, if rough positioning tab 230 has a thickness of 50 μm, the corresponding dimension of slot 112 may be 53-60 μm. In one embodiment, the width 1609 of tab 230 may be 200 μm. In this embodiment, the corresponding dimension of slot 112 may be 10-30 μm greater than the width 1609 of tab 230, i.e., may be 210-230 μm. Similar principles apply to the thickness (but not the width, as explained below) of tabs 240 and 270.

For fine-positioning tabs 240 and 270, the corresponding width dimensions for slots 114 and 122, respectively, may be slightly smaller than the uncompressed width dimensions 1608 and 1707 for tabs 240 and 270, respectively. By making the widths of slots 114 and 122 slightly smaller that the uncompressed widths 1608 and 1707 of tabs 240 and 270, respectively, tabs 240 and 270 will compress upon insertion into slots 114 and 122, respectively.

Figure 18A:
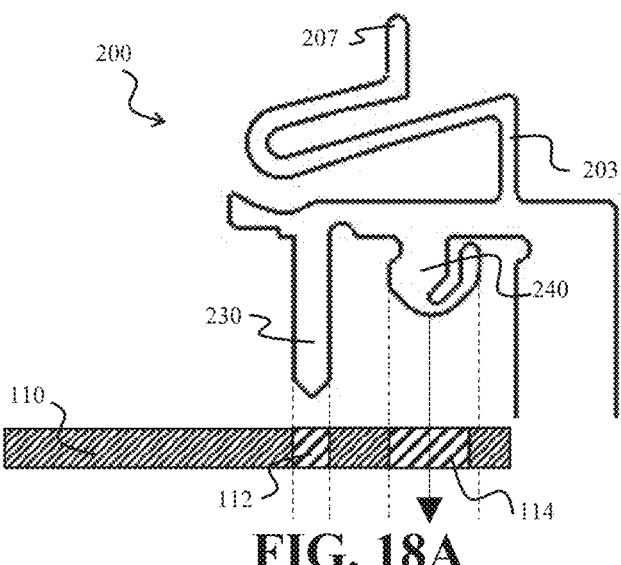
FIGS. 18A-C show insertion of an exemplary socketed probe into an upper guide plate.
Figure 18B:
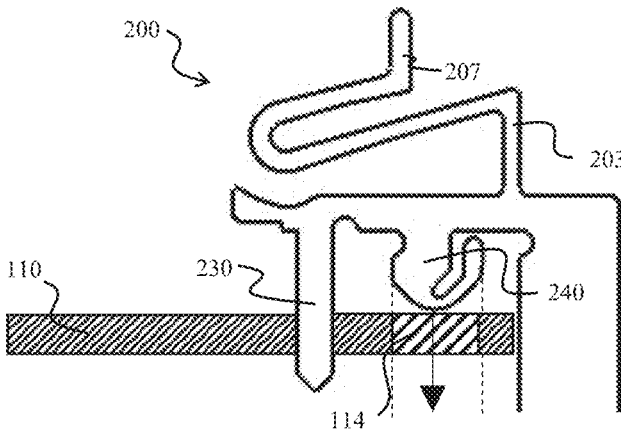
Figure 18C:
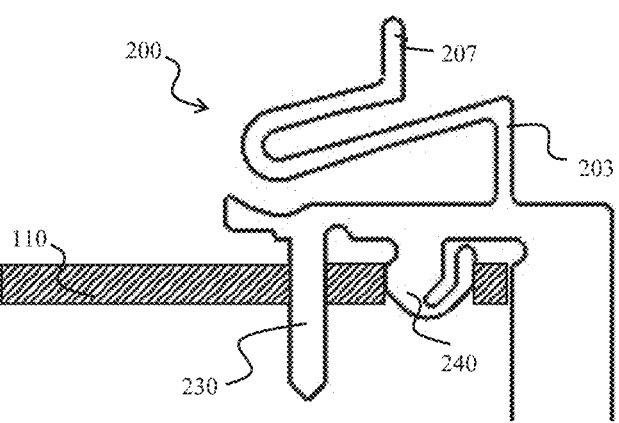

An exemplary insertion of the upper tabs is illustrated in FIGS. 18A-C. As shown in FIG. 18A, the width of slot 114 may be slightly less than width 1608 of upper fine positioning tab 240. As shown in FIG. 18B, as socketed probe 200 is inserted into upper guide plate 110, rough positioning tab 230 will be inserted into upper guide plate 110 before fine positioning tab 240 is inserted into upper guide plate 110. As shown in FIGS. 18B and 18C, fine positioning tab 240 will compress during the insertion process, thereby ensuring that the left edge of fine positioning tab 240 is aligned with the left edge of slot 114. FIGS. 18A-C are not meant to show precise locations and/or dimensions, but merely to provide a conceptual view of an exemplary system. Lower fine positioning tab 270 is configured to behave similarly to upper fine positioning tab 240.

To reiterate as already explained herein: The dimensions of tabs 230, 240, and 270 may vary widely depending on constraints of a particular application or problem domain. Although the respective slots 112, 114, and 122 could have the same dimensions as tabs 230, 240 (in fully compressed state), and 270 (in fully compressed state), for practical reasons it may be beneficial to make the dimensions of slots 112, 114, and 122 slightly greater than the corresponding dimensions of tabs 230, 240 (in fully compressed state), and 270 (in fully compressed state), respectively.

The main purpose of fine positioning tab 240 is to secure socketed probe 200 at a known, certain, and stable x-dimension location. As shown in FIGS. 1-2, the uncompressed width of tab 240—from left edge 241 to the right (far) edge of spring arm 242—may be slightly greater than the width of associated guide slot 114 in upper guide plate 110. The fully compressed width of tab 240 may be equal to or slightly less than slightly less than the width of associated guide slot 114 in upper guide plate 110. The spring arm design of tab 240 (including spring arm 242), will result in pressing edge 241 of tab 240 against wall 115 of guide slot 114 in upper guide plate 110, thereby ensuring a predictable and stable x-dimension position of socketed probe 200 relative to upper guide plate 110. In general, inflection point 243 may be sufficiently skinny to allow spring arm 242 to bend toward edge 241 when pressure is applied, e.g., from wall 115 of slot 114 in upper guide plate 110. This design ensures that edge 241 is flush with and in contact with wall 115 of guide slot 114 in upper guide plate 110.

Corner cutouts 232, 234, and 236, which are shown and marked in FIGS. 1-2, are not strictly necessary, but are a practical feature to mitigate the likelihood of the undesirable results of imperfect 90-degree corners in the manufacturing process, which imperfect corners could result in improper positioning of socketed probe 200.

Handling tab 220 is for convenience in manufacturing, handling, manipulating, placing, orienting, and moving socketed probe 200. For example, handling tab 220 may be used for grasping by fingers, pliers, or another tool.

Spring-bend cutout 222 allows for downward displacement of spring arm 210 without coming into contact with horizontal support arm 225.

The length of connector arm 250 may vary depending on the dimensions of spacer 130 and other dimensions of a particular embodiment or application.

Lower Assembly

Although the disclosure herein shows rough positioning tab 230 as being a part of and/or connected to upper horizontal support arm 225, and being designed to engage upper guide plate 110, in an alternative embodiment a rough positioning tab may be designed to engage lower guide plate 120. Although this approach is feasible, it may have several drawbacks. First, it may be more difficult to insert a rough positioning tab 230 into the lower guide plate 120 because the corresponding slot in the lower guide plate 120 may be visually obscured in whole or in part. Additionally, depending on the length of the rough positioning tab 230, a rough positioning tab 230 that engages the lower guide plate 120 may protrude, e.g., a few hundred microns, toward the DUT surface 700, thereby reducing the effective extension of DUT contact point arm 257. Increasing the length of DUT contact point arm 257 to offset this reduced effective extension may compromise the characteristics of DUT contact point arm 257, e.g., reducing its stiffness and ability to scrub laterally, i.e., to scrape across the surface of DUT pad 710 and "dig in," as shown in FIG. 19_a-b_.

As shown in FIGS. 1-3, lower fine-positioning tab 270 (including edge 271 and spring arm 272) positions DUT contact 255 in the x-dimension relative to lower guide plate 120. In one embodiment, x-dimension 1707 from left edge 271 of lower fine-positioning tab 270 to right edge of uncompressed spring arm 272 may be slightly greater than the width of slot 122 in lower guide plate 120, so that spring arm 272 is compressed toward edge 271 when tab 270 is inserted into slot 122 in lower guide plate 120, and edge 271 and right edge of spring arm 272 thereby engage walls of slot 122, respectively. In this manner, edge 271 is pressed into position against the interior walls of slot 122 so that it is flush against the opposing interior wall of slot 122, thereby ensuring a predictable and stable x-dimension position for contact point 255 relative to lower guide plate 120.

Support arm 275_a-b_ supports contact arm 257 and associated contact point 255. In one embodiment, as shown in FIGS. 1-3, support arm 275_a-b_ may comprise a two-arm design comprising a top arm 275_a_ that is substantially straight and a bottom arm 275_b_ that is slightly curved.

Figure 19A:
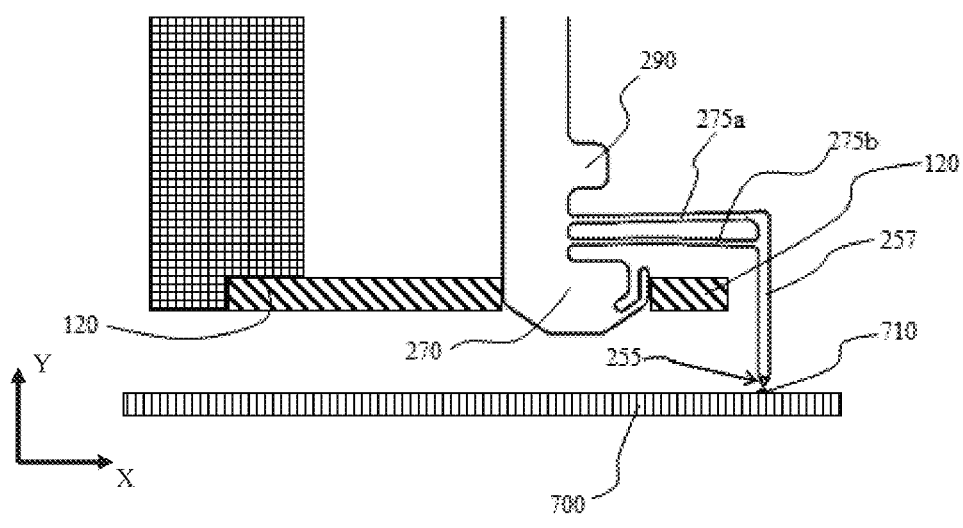
FIGS. 19A-B show the scrubbing motion on a device under testing.
Figure 19B:
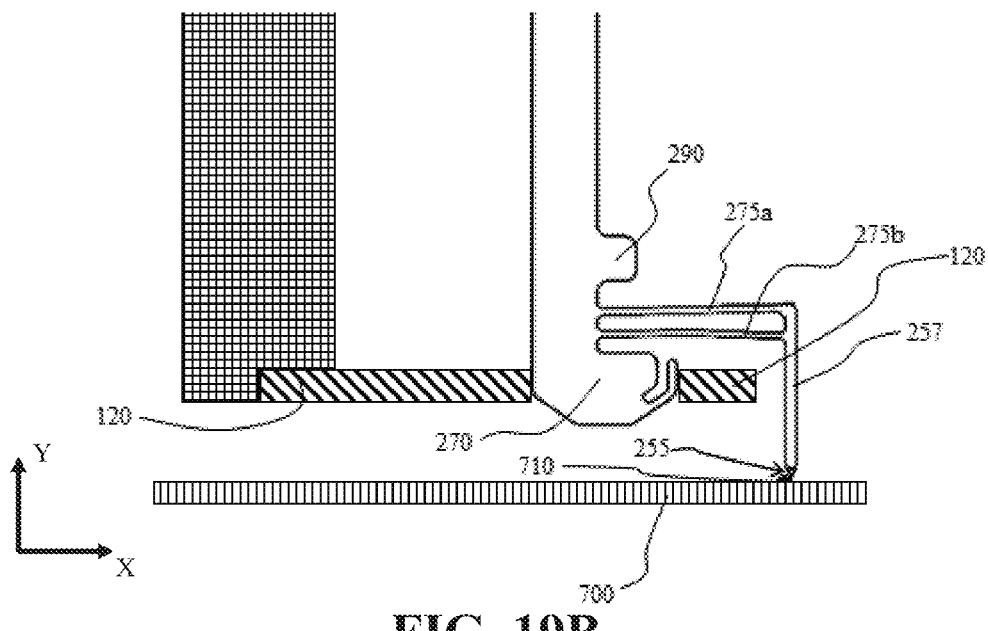

As shown in FIGS. 19A-B, the mismatched lengths of 275_a_ and 275_b_, along with the curvature on bottom arm 275_b_ result in a tendency for contact point 255 to "scrub" DUT pad 710, i.e., to scrape across the surface of DUT pad 710 and "dig in." This phenomenon may be beneficial because it allows contact point 255 to come in contact with fresh and clean conductive material in DUT pad 710, instead of being in contact with potentially deteriorated or dirty surface material on DUT pad 710. The two-arm design allows contact point 255 to maintain the same z-dimension, i.e., in and out of the direct profile drawing in FIG. 17, and to remain aligned in the z-dimension with DUT pad 710, while changing the angle of arm 257 relative to lower guide plate 120 and, correspondingly, changing the x-dimension of contact point 255. This x-dimension movement contact point 255 along DUT testing pad 710 may be referred to as "scrub."

Handling tab 290 is for convenience in manufacturing, handling, manipulating, placing, orienting, and moving socketed probe 200. For example, handling tab 290 may be used for grasping by fingers, pliers, or another tool. Alternatively, handling tab 290 may be used as a push point for pushing socketed probe 200 into lower guide plate 120.

The dimensions and geometry of the two-bar design may be adjusted to account for different applications and domain-specific needs/requirements.

Socketed probe 200 may be made out of various materials or combinations of materials. In a preferred embodiment, socketed probe 200 is monolithic. In general, the material(s) from which socketed probe 200 is made will have several characteristics: electrically conductive and substantially rigid (but bendable where the material is thin enough, as described herein). Feasible materials for socketed probe 200 may include, but are not limited to, C17200 BeCu, C17500 BeCu, Deringer Ney materials (H3C, P7, P25, etc), AgCu alloy, and other materials or combinations of materials as may be known in the art.

Spacer

As shown in FIG. 3, upper guide plate 110 may be connected/secured to lower guide plate 120 by a structure/component that may be referred to as a "spacer" 130. The spacer may be any apparatus, device, hardware, or system that maintains upper guide plate 110 and lower guide plate 120 in orientations and positions relative to each other so that upper guide plate 110 is substantially parallel with lower guide plate 120 and the position of upper guide plate 110 is fixed relative to the position of lower guide plate 120.

The position of DUT 700 relative to lower guide plate 120 may be maintained in several ways. In one embodiment, DUT 700 may be on or secured to a movable chuck that may align DUT 700 and, consequently, DUT contact pad 710, with lower guide plate 120. The chuck may move upward to probe tip 255 and establish contact between probe tip 255 and contact pad 710. In other embodiments, other hardware, machinery, or otherwise may be used to set or maintain the spatial relationship between DUT 700 and lower guide plate 120.

Upper Guide Plate

Figure 4A:
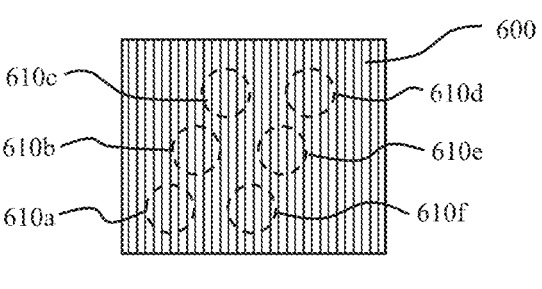
FIG. 4A is a top-down view of a PCB in which the six dashed circles represent testing PCB pads located on the underside of the PCB.
Figure 4B:
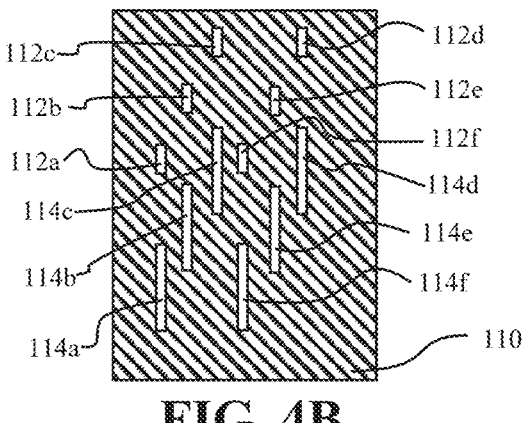
FIG. 4B is a top-down view of an upper guide plate.

As shown in FIG. 4B, which is a top-down view of a portion of exemplary upper guide plate 110, upper guide plate 110 may be a device having guide slots for insertion of tabs 230 and 240 from socketed probe 200. In one embodiment, the portions of upper guide plate 110 that come in contact with socketed probe 200 may be substantially flat so that the portions of socketed probe 200 that come in contact with upper guide plate 110 are flush with surface(s) of upper guide plate 110, or at least rest against upper guide plate 110 in a stable and secure manner. It may be possible to use an upper guide plate that is not flat for contact with a socketed probe, but this approach may give rise to unnecessary difficulties and design complexities.

In one embodiment, upper guide plate 110 may be a flat device, e.g., as shown in FIG. 4B, with slots dimensioned for insertion of tabs 230 and 240 of socketed probe 200. For example, in one embodiment socketed probe 200 may be made of beryllium copper that is 50 μm (micrometers) thick. In this embodiment, slots 112_a-n_ and 114_a-n_ in upper guide plate 110 may be 48 μm wide so that tabs 230 and 240 fit comfortably and snugly in slots 112 and 114 respectively.

In one embodiment, tab 230 may be 200 μm wide and tab 240 may be, uncompressed, 530 μm wide. For these dimensions, slot 112 for tab 230 may be 220 μm long and slot 114 for tab 240 may be 510 μm long. In one embodiment, thickness of upper guide plate 110 may be 600 μm.

In one embodiment, upper guide plate 110 and lower guide plate 120 may be made from silicon nitride. Many non-conductive materials are known in the art and may be used for upper guide plate 110 and lower guide plate 120.

Lower Guide Plate

Lower guide plate 120 is similar to upper guide plate 110, except that slot 122 in lower guide plate 120 is dimensioned to accommodate tab 270 of socketed probe 200. In one embodiment in tab 270 may be 1,290 μm wide uncompressed, and may be 1,270 μm wide in a fully compressed state. For these dimensions, slot 122 for tab 270 may be 1,275 μm long. In one embodiment, thickness of lower guide plate 120 may be 400 μm.

Figure 4C:
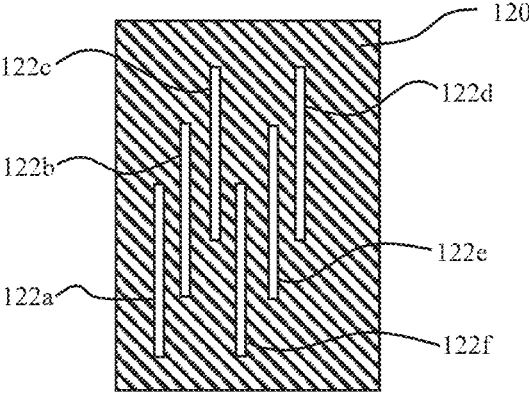
FIG. 4C is a top-down view of a lower guide plate.

FIGS. 4A-C show top-down views of an exemplary PCB 600, upper guide plate 110, lower guide plate 120, and DUT 700, respectively. FIGS. 4A-C are not meant to show precise locations and/or dimensions, but merely to provide a conceptual view of an exemplary system comprising PCB 600, upper guide plate 110, lower guide plate 120, and DUT 700, respectively.

FIG. 4A shows a top-down view of a PCB 600. The six dashed circles represent testing PCB pads 610*a-n*. They are dashed because they are on the bottom of PCB 600 are therefore not visible in a top-down view.

FIG. 4B shows a top-down view of an upper guide plate 110. Rough-positioning slots 114*a-n* and fine positioning slots 112*a-n* correspond to testing PCB pads 610*a-n*, respectively.

FIG. 4C shows a top-down view of a lower guide plate 120. Fine positioning slots 122*a-n* correspond to slots 114*a-n* and 112*-a-n*, respectively, in upper guide plate 110.

Figure 4D:
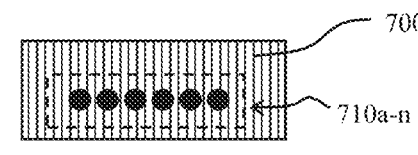
FIG. 4D is a top-down view of an exemplary DUT.
Figure 5:
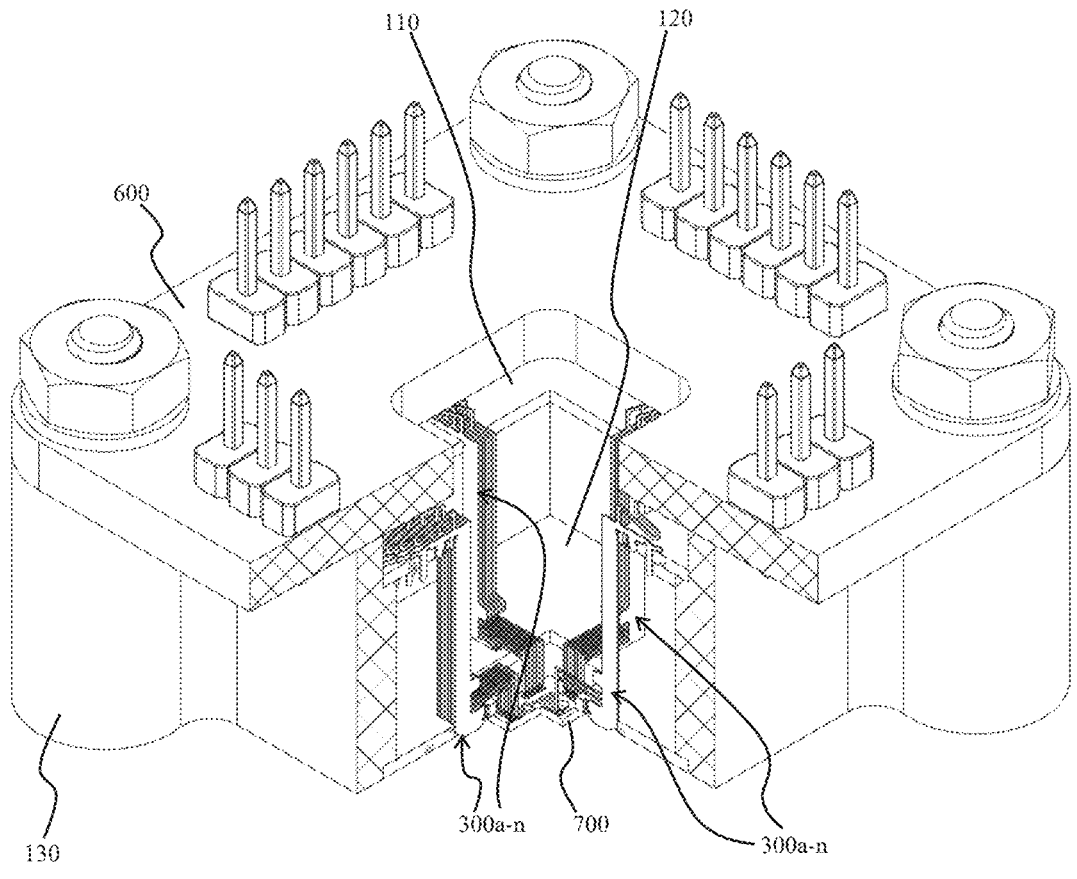
FIG. 5 is an elevated-angle sectional view of an exemplary testing assembly.

FIG. 4D shows a top-down view of exemplary DUT 700. DUT pads 710*a-n* correspond to testing PCB pads 610*a-n*, slots 114*a-n* and 112*-a-n* on upper guide plate 110, and slots 122*a-n* on lower guide plate 120.

Fabrication

Many technologies, machines, and/or processes may be used to fabricate socketed probes as described herein. For example, a socketed probe may be fabricated by laser cutting from metal foil; etching from metal foil; stamping/forming; MEMS/electroplating/electroforming; combinations of one or more of these approaches; and/or other technologies and/or methods that may be known in the art.

Laser cutting from metal foil may comprise subtractive processing beginning with a thin metal foil and using a laser to cut one or more probes out of that foil. This technology is well-known. Achieving the required tolerances and dimensions may require a high-end laser system.

Etching from metal foil may comprise subtractive processing beginning with a thin metal foil and using masking and chemical etching to release/cut one or more probes out of the foil.

Stamping/forming may be used to manufacture a probe by beginning with a wire, strip, or foil and smashing, stretching, and/or cutting a probe into its final geometry.

MEMS/electroplating/electroforming is an additive manufacturing technology in which metal is grown on a substrate in specific/desired areas using masking.

Combinations of the above methods may include, but are not limited to: plating metals to form a foil and then etching or laser-cutting to form a probe; stamping, etching, or laser-cutting to form probes and then plating metal on the formed geometry.

In one embodiment the probed socket 200 is one with uniform thickness. An advantage of a probed socket 200 with uniform thickness is the efficiency and ease of manufacture. However, a socketed probe 200 could have a non-uniform thickness, e.g., the upper handling tab 220, upper rough positioning tab 230, and upper fine positioning tab 240 are of one consistent thickness and the connector arm 250 tapers to a thinner thickness for the lower handling tab 290, lower horizontal support arm 275*a-b*, DTU contact point arm 257 to better accommodate the dimensions of DTU 700.

In another embodiment of non-uniform thickness the connecting arm 250 may be thinner than the upper end and lower end of the socketed probe 200. The thinner connecting arm 250 may then be bent to a desired shape after manufacturing but prior to the installation in the testing system. The thinner connecting arm 250 allows for ease of efficient manufacturing while allowing for later modifications of the design for proper fit within a testing system.

In one embodiment of a system as disclosed herein, socketed probes 300*a-n* have varying dimensions. The dimensions of socketed probe 200 may be modified for varying DUT pads 710*a-n*. For example, socket probes 300*a-d* may have a longer DUT contact arm 257 than the DUT contact arm of socket probes 300*e-n*. These varying lengths of DUT contact arm 257 allow for simultaneous testing of DUT pads 710*a-n* of varying heights.

Preferred Embodiment

Referring to the dimensions shown in FIGS. 16 and 17, a preferred embodiment may use the following dimensions. FIG. 16 illustrates the key dimensions for the upper portion of an exemplary socketed probe. FIG. 17 illustrates the key dimensions for the lower portion of an exemplary socketed probe.

Dimension 1601 may be 1,112 μm, measured from the straight edge of cantilever arm 210 to the inflection point on the arm. Dimension 1602 measures from the straight edge of the cantilever arm 210 to the center of the PCB contact point 205 and is 707 μm. Dimension 1604, the width of PCB contact arm 207, is 125 μm. Cantilever arm 210 has three dimensions for thickness, 1603, 1605, and 1611 respectively. Dimension 1603 is 100 μm, dimension 1605 is 950 μm, and dimension 1611 is 109 μm.

Dimension 1606, which is the height of horizontal support arm 225, is 200 μm.

Dimension 1610, which is the height of rough positioning tab 230, is 942 μm. Dimension 1609, which is he width of rough positioning tab 230, is 200 μm. Fine positioning tab 240 has an overall width 1608 of 530 μm and a height 1607 of 467 μm.

As shown in FIG. 17, or the lower portion of a socketed probe 200, the lower handling tab 290 has a width 1701 of 350 μm and a height 1702 of 400 μm. Dimension 1703, which is the height of lower horizontal support art 275*a*, is 63 μm. Dimension 1704, which is the height of lower horizontal support art 275*b*, is 50 μm. Angle 1711, which is the angle between lower horizontal support arm 275*a* and DUT contact arm 257, may be 271°. This angle facilitates and tunes the behavior of DUT contact 255 to "scrub" DUT 700 as needed. Dimension 1705, which is the width of DUT contact arm 257, is 96 μm.

Lower positioning tab 270 has an overall width 1707 of 1.290 μm. DUT contact point arm 257 has a width 1705 of 0.096 μm. Fine positioning spring arm 272 has a width 1708 of 0.070 μm. Positioning tab 270 has a width 1709 of 1.120 μm and a height 1710 of 0.650 μm.

The distance 1706 from the left edge of lower positioning tab 270 to the right edge of DUT contact arm 257 2,373 μm.

The overall height for a socket probe 200 is to be tall enough to accommodate both an upper and lower guide plates, 110 and 120 respectively, which are held in position by spacer 130. Because spacers may vary by testing needs, no exemplary dimension is provided for the preferred embodiment described above in conjunction with FIGS. 16 and 17.

Guide Plates

FIG. 15 shows an exemplary testing PCB 600 and an an exemplary upper guide plate 110 that is designed/configured for testing PCB 600.

Figure 20:
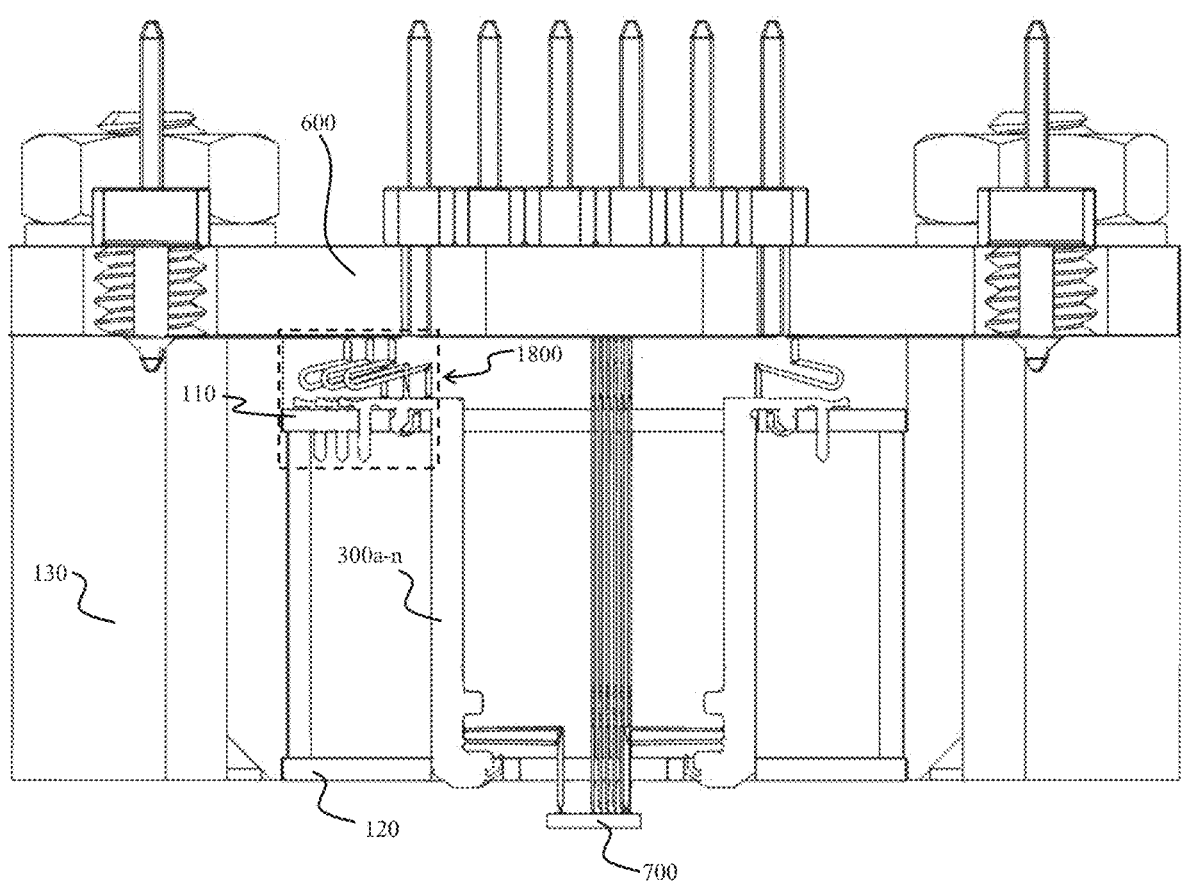
FIG. 20 is a cross-section view of an exemplary testing assembly that illustrates the use of multiple socketed probes with varying upper horizontal support arm lengths within a testing assembly.

FIG. 20 shows an exemplary DUT 700 and an exemplary lower guide plate 120 that is designed/configured for DUT 700.

In general, many configurations and specifications exist or may be used for a DUT 700 and/or testing PCB 600. Guide plates and socketed probes may be adjusted, modified, configured, and/or designed for the various configurations of DUTs 700 and/or testing PCBs 600.

Guide plates may be made out of various materials or combinations of materials as are known in the art. In general, materials for guide plates may have several characteristics: non-electrically-conductive; substantially rigid; and/or amenable to material removeable, e.g., for forming slots as described herein. Exemplary materials for guide plates may include, but are not limited to, Photoveel, Photoveel II, Photoveel II-s, macerite, macor, PEEK, Silicon nitride, vespel, or glass. In one embodiment, silicon nitride may be used.

Guide plates, including the slots described herein, may be fabricated using various technologies and processes known in the art, e.g., etching, laser cutting, or mechanically machining with solid round cutting tools. Multiple guide plates may be combined if required.

Dimensions and Sizes

In one embodiment, a socketed probe may have the dimensions as previously described shown in FIGS. 16 and 17. In some embodiments, a socketed probe may be available in varying horizontal offsets to facilitate space transformation patterns as shown, e.g., in FIG. 20.

Other Views

FIGS. 6-15 show various views and angles of space transformer system 100 as described herein.

Figure 6:
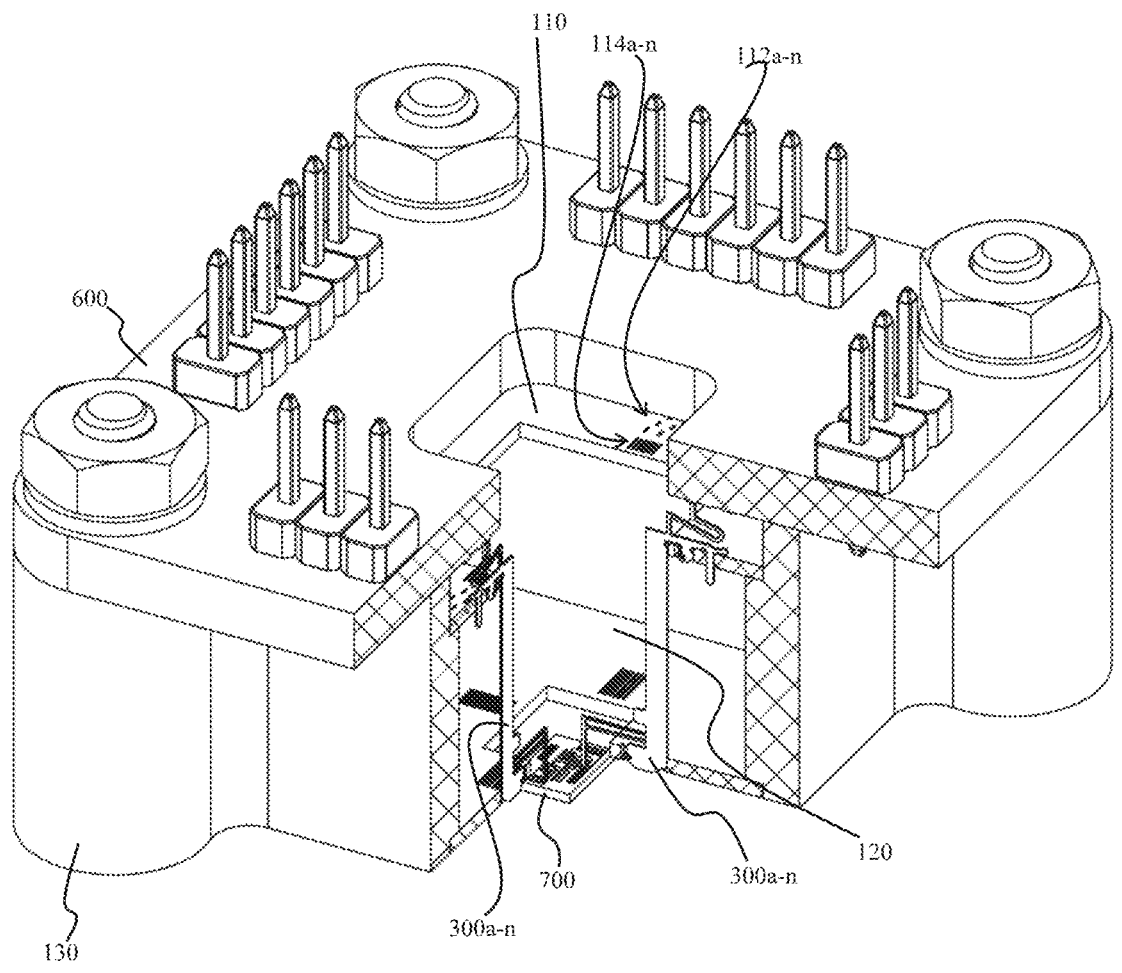
FIG. 6 is an elevated-angle sectional view of an exemplary testing assembly in which the upper guide plate is visible.

FIG. 6 shows an upper elevated sectional view of space transformer system 100 having a one-quarter cutaway.

Figure 7:
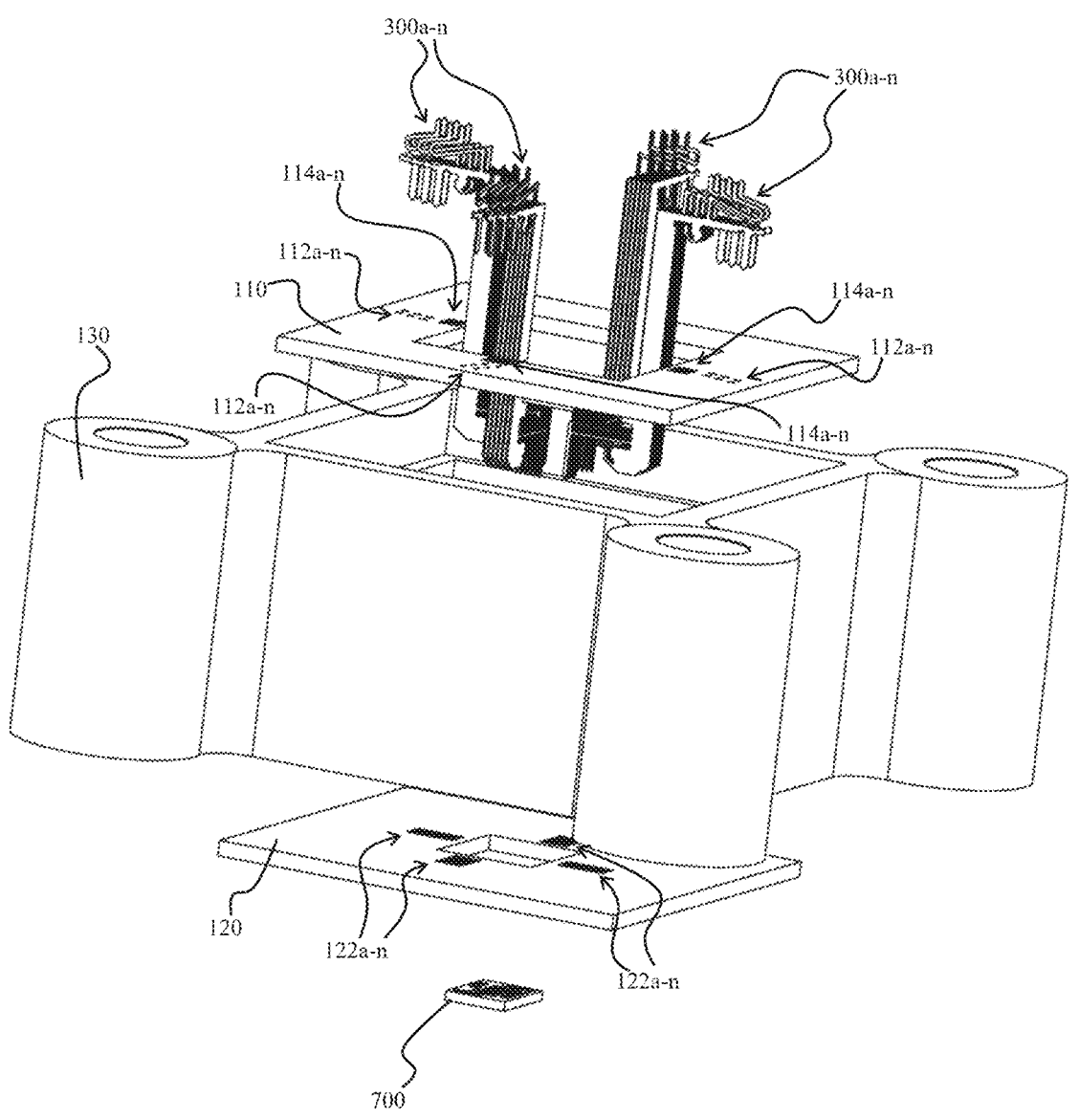
FIG. 7 is an elevated-angle partially exploded view of an exemplary testing assembly.

FIG. 7 shows an upper elevated exploded view of space transformer system 100 without testing PCB 600.

Figure 8:
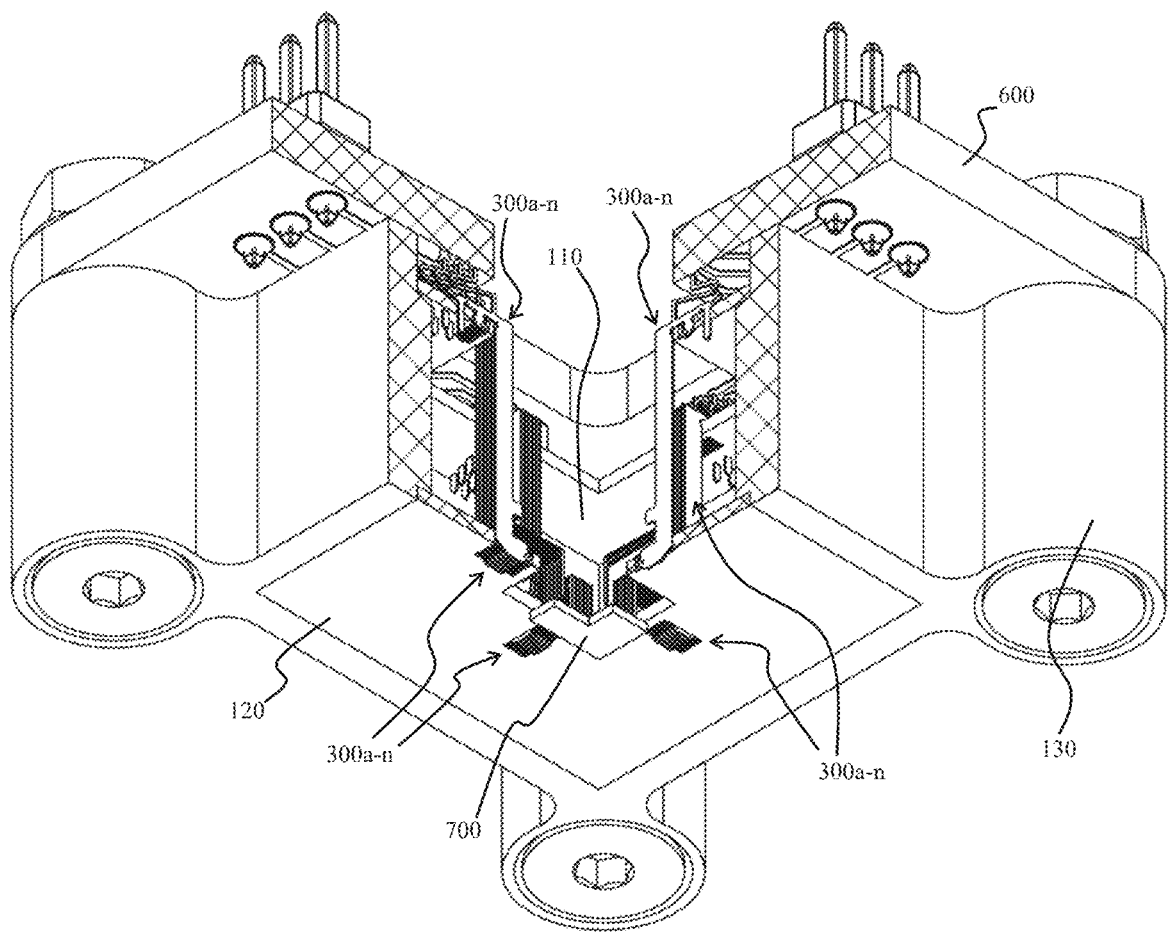
FIG. 8 is a lower-angle perspective sectional view of an exemplary testing assembly.

FIG. 8 shows a lower sectional view of space transformer system 100 having a one-quarter cutaway.

Figure 9:
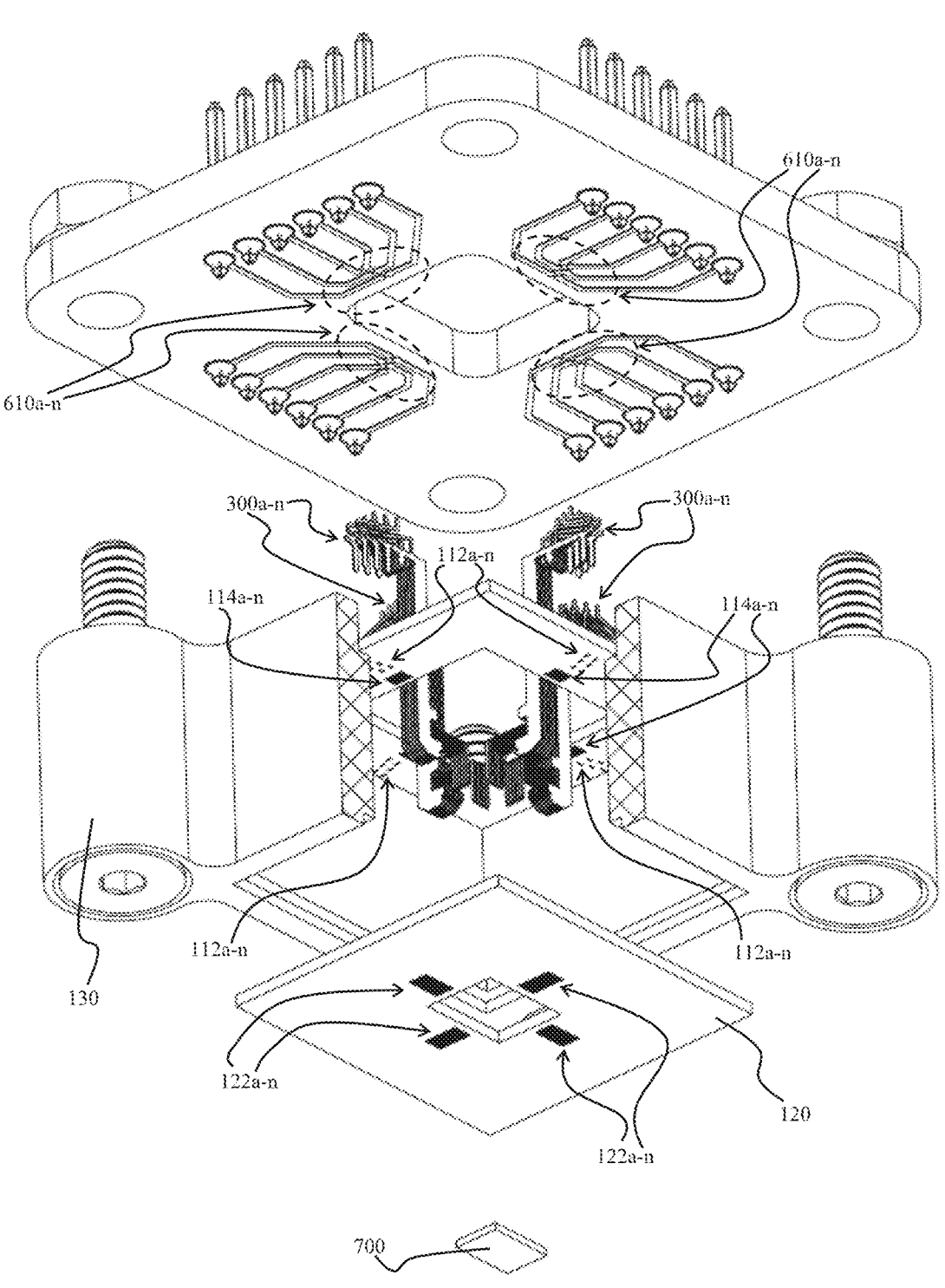
FIG. 9 is a lower-angle fully exploded view of an exemplary testing assembly.

FIG. 9 shows an exploded lower angle view of space transformer system 100 having a one-quarter cutaway of spacer 130.

Figure 10:
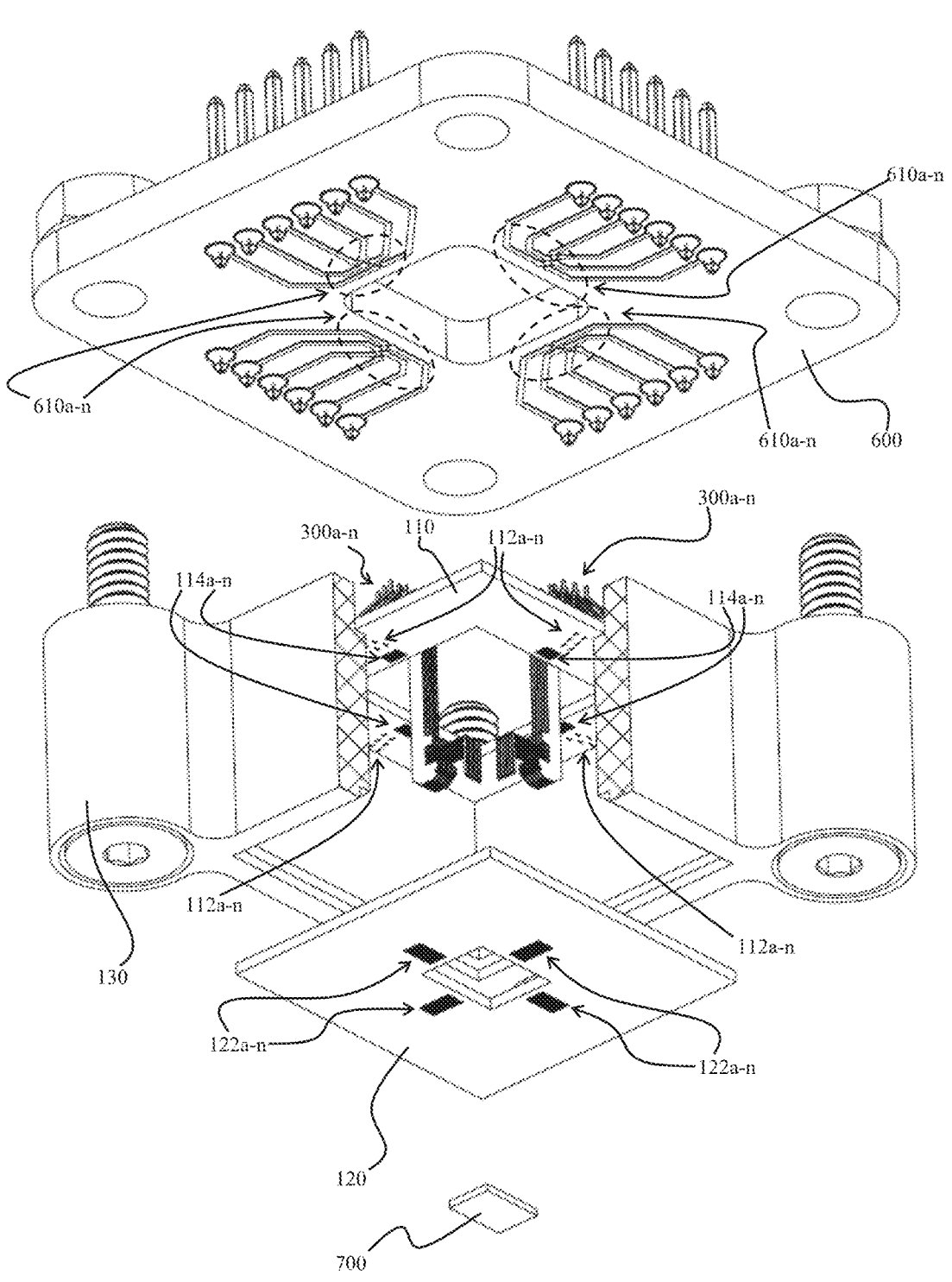
FIG. 10 is a lower-angle partially exploded view of an exemplary testing assembly.

FIG. 10 shows an exploded lower angle view of space transformer system 100 having a one-quarter cutaway of spacer 130 and with two sides of socketed probes omitted)

Figure 11:
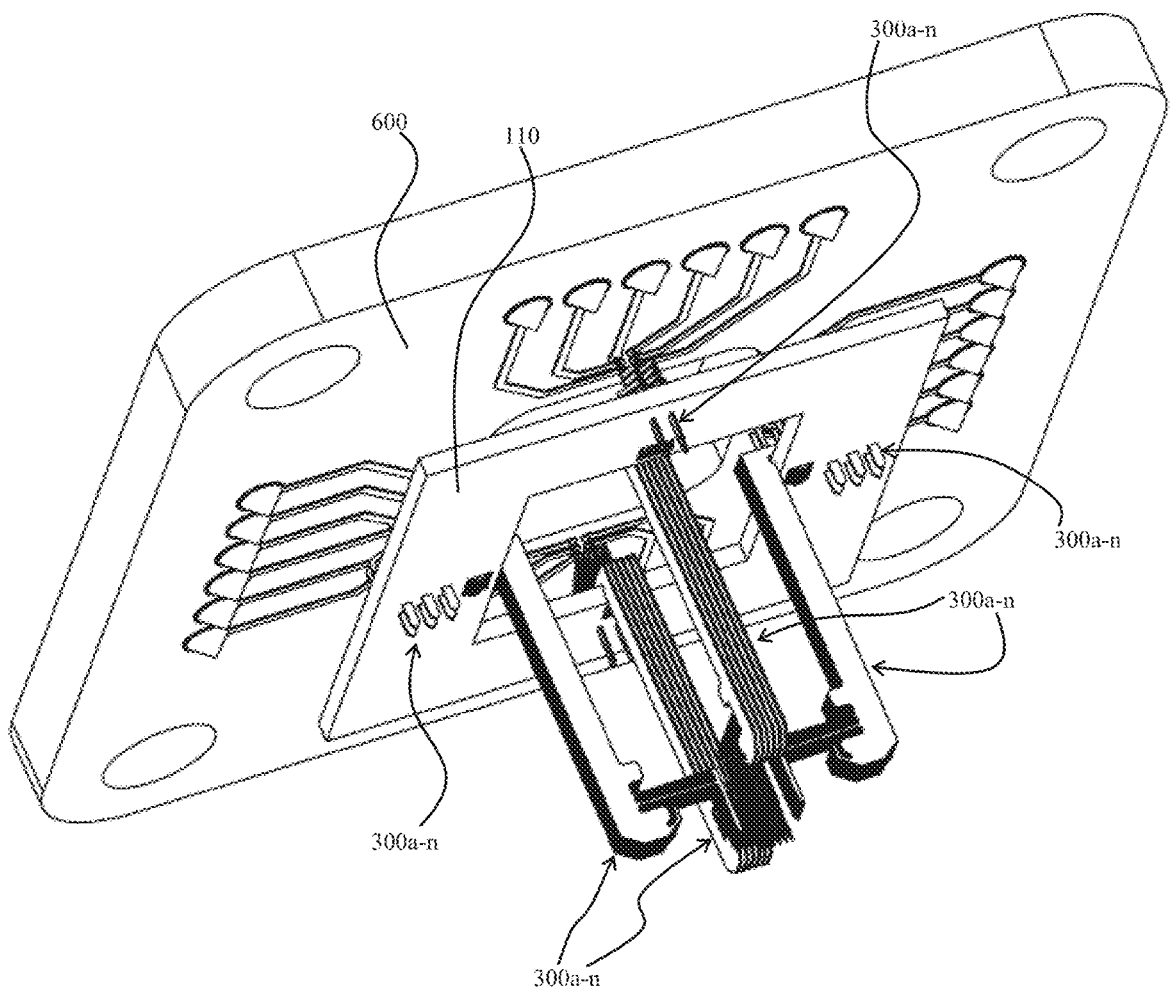
FIG. 11 is a lower angle view of space transformer system 100 without some parts of the lower guide plate and without the DUT.

FIG. 11 shows a lower angle view of space transformer system 100 without some parts of the lower guide plate and without the DUT.

Figure 12:
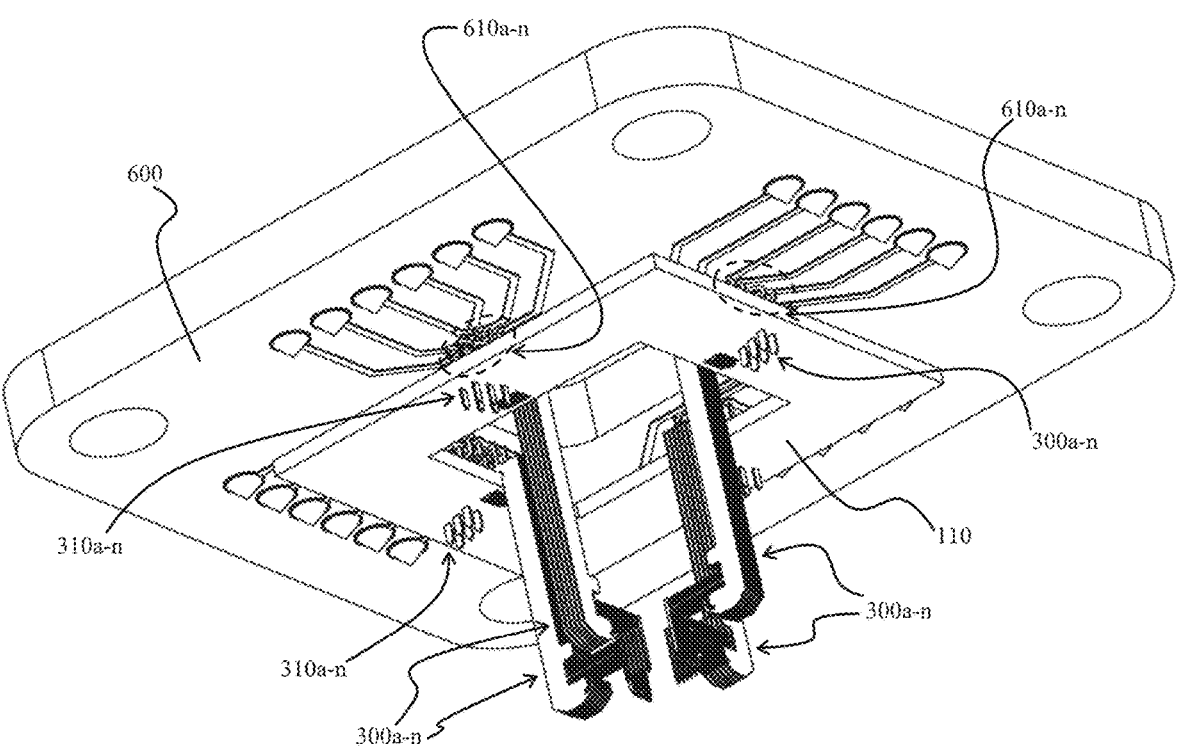
FIG. 12 is a lower angle view of space transformer system 100 without some parts of the lower guide plate and without the DUT.

FIG. 12 shows a lower angle view of space transformer system 100 without some parts of the lower guide plate and without the DUT.

Figure 13:
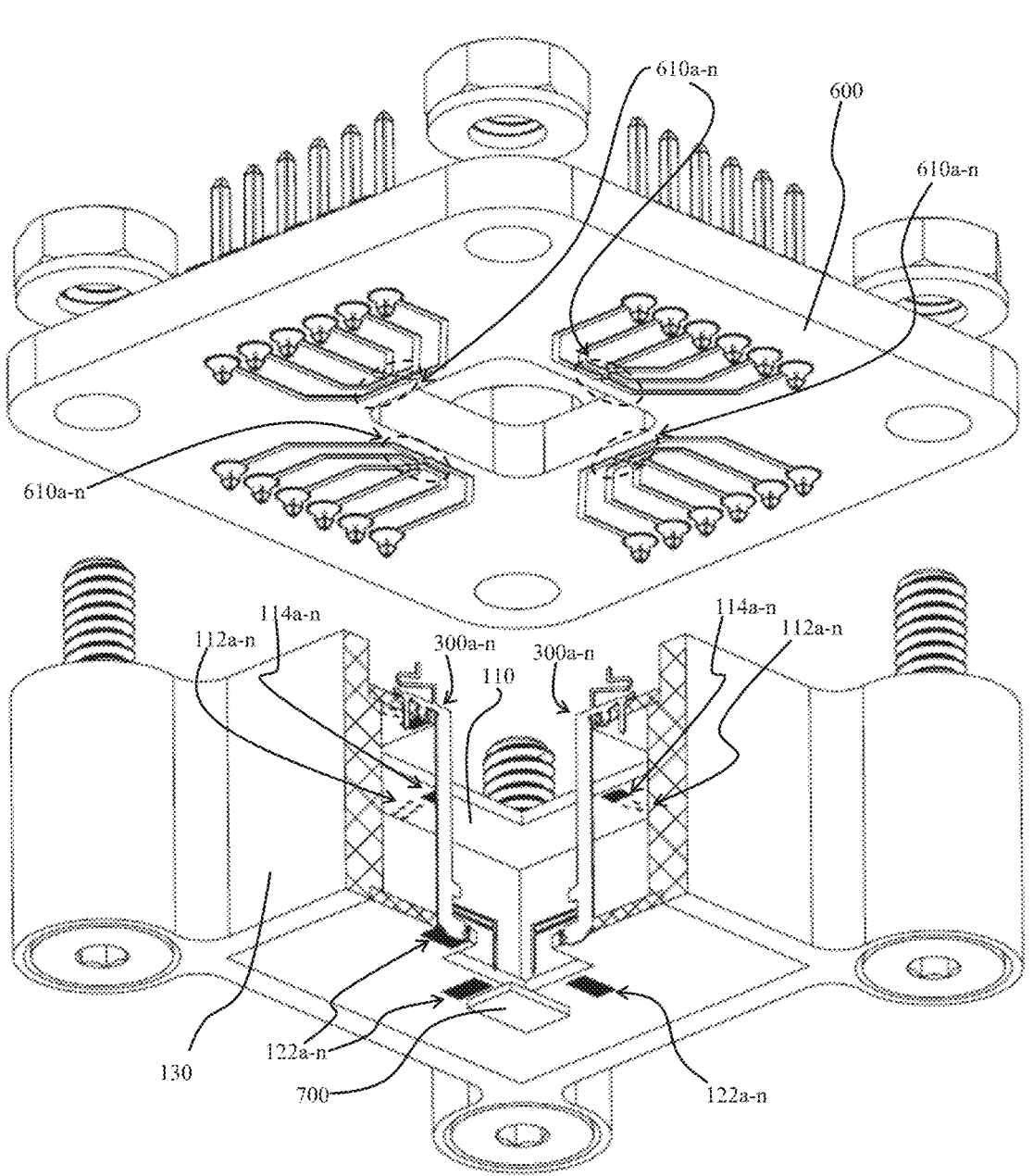
FIG. 13 is an exploded lower angle view of space transformer system 100 with a one-quarter cutaway of the assembly comprising the lower guide plate, spacer, upper guide plate, and associated socketed probes.

FIG. 13 shows an exploded lower angle view of space transformer system 100 with a one-quarter cutaway of the assembly comprising the lower guide plate, spacer, upper guide plate, and associated socketed probes.

Figure 14:
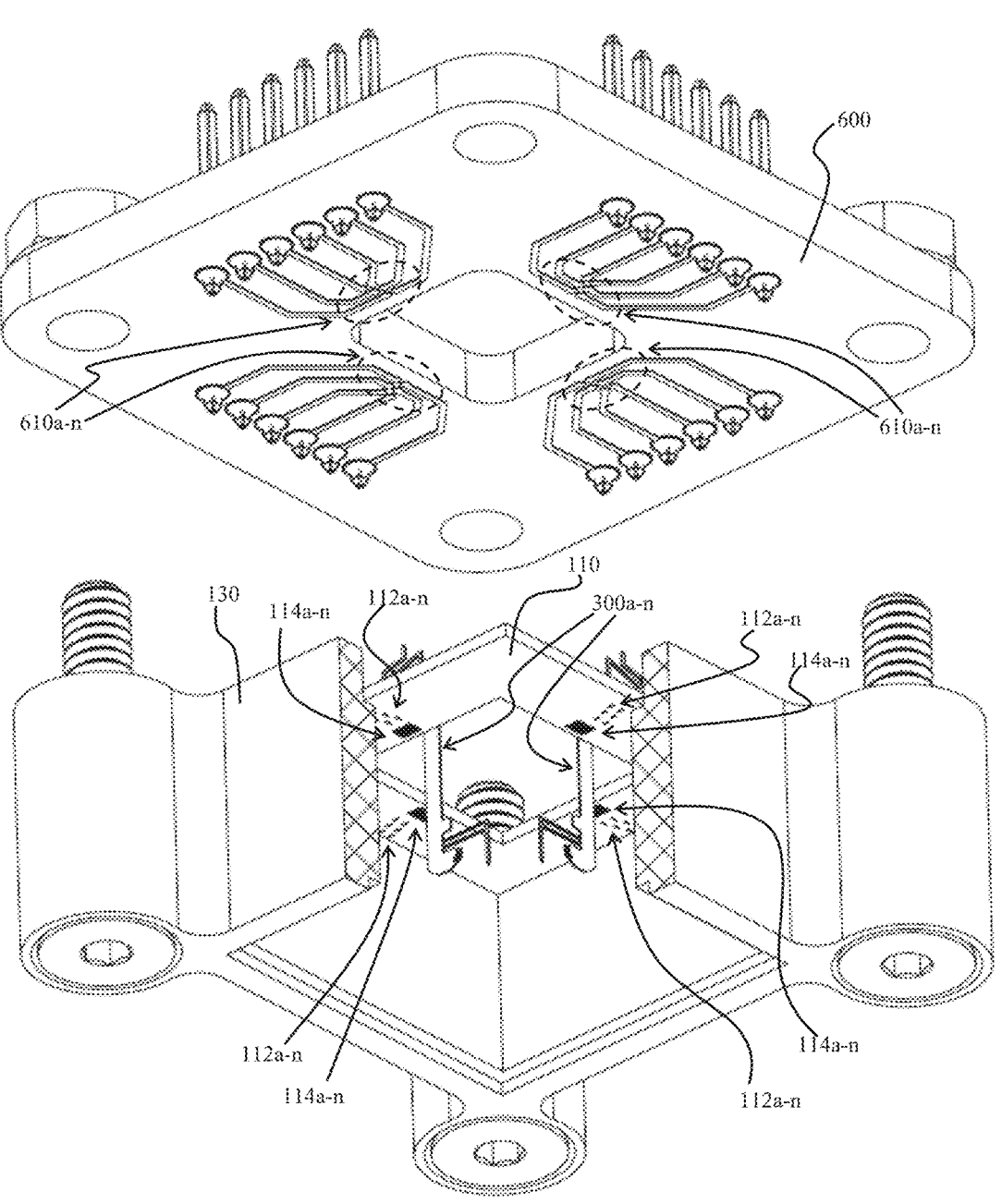
FIG. 14 is an exploded lower angle view of space transformer system 100 with a one-quarter cutaway of the assembly comprising the lower guide plate, spacer, upper guide plate, and associated socketed probes—except for the upper guide plate, and having only two socketed probes.

FIG. 14 shows an exploded lower angle view of space transformer system 100 with a one-quarter cutaway of the assembly comprising the lower guide plate, spacer, upper guide plate, and associated socketed probes-except for the upper guide plate, and having only two socketed probes.

FIG. 15 shows an exploded lower angle view of space transformer system 100 without the lower guide plate and DUT, and having only two socketed probes.

What is claimed is:

1. A socketed probe, comprising:
an upper assembly;
a lower assembly; and
a connector arm connecting the upper assembly to the lower assembly;
wherein:
the upper assembly comprises:
an upper horizontal support arm;
a contact support arm;
a cantilever spring arm;
a contact point arm;
a contact configured to be displaced in an upper assembly contact principal displacement direction through planar compression of the cantilever spring arm; and
an upper support arm fine positioning tab;
the lower assembly comprises:
a lower horizontal support arm;
a contact point arm;
a contact; and
a lower support arm fine positioning tab;
the upper support arm fine positioning tab is configured to be inserted into a slot such that the insertion movement is parallel to the upper assembly contact principal displacement direction;
the lower support arm fine positioning tab is configured to be inserted into a slot such that the insertion movement is parallel to the upper assembly contact principal displacement direction; and
the insertion movement of the upper support arm fine positioning tab is in the same direction as the insertion movement of the lower support arm fine positioning tab.

2. The socketed probe of claim 1, wherein at least one of the upper assembly and the lower assembly further comprises a rough positioning tab.

3. The socketed probe of claim 2, wherein the upper assembly comprises a rough positioning tab.

4. The socketed probe of claim 3, wherein the rough positioning tab extends further from the upper horizontal support arm than the upper support arm fine positioning tab.

5. The socketed probe of claim 1, wherein the upper support fine positioning tab comprises a spring arm.

6. The socketed probe of claim 1, wherein the lower support arm fine positioning tab comprises a spring arm.

7. The socketed probe of claim 1, wherein the upper assembly comprises a handling tab.

8. The socketed probe of claim 1, wherein the lower assembly comprises a handling tab.

9. The socketed probe of claim 1, wherein:
the lower horizontal support arm comprises a first lower support sub-arm and a second lower support sub-arm;
the first lower support sub-arm and the second lower support sub-arm are substantially parallel to each other; and one of the first lower support sub-arm and the second lower support sub-arm is substantially straight and the other of the first lower support sub-arm and the second lower support sub-arm is slightly curved.

10. The socketed probe of claim 1, wherein:

the upper assembly comprises a rough positioning tab;

the rough positioning tab extends further from the upper horizontal support arm than the upper support arm fine positioning tab;

the upper support fine positioning tab comprises a spring arm;

the upper assembly comprises an upper handling tab;

the lower assembly comprises a lower handling tab;

the lower horizontal support arm comprises a first lower support sub-arm and a second lower support sub-arm;

the first lower support sub-arm and the second lower support sub-arm are substantially parallel to each other; and one of the first lower support sub-arm and the second lower support sub-arm is substantially straight and the other of the first lower support sub-arm and the second lower support sub-arm is slightly curved.

11. A socketed probe system, comprising:

an upper guide plate;

a lower guide plate;

a spacer; and a socketed probe;

wherein:

the socketed probe comprises an upper assembly, a lower assembly, and a connector arm connecting the upper assembly to the lower assembly;

the upper assembly comprises:

an upper horizontal support arm;

a contact support arm;

a cantilever spring arm;

a contact point arm;

a contact configured to be displaced in an upper assembly contact principal displacement direction through planar compression of the cantilever spring arm; and an upper support arm fine positioning tab;

the lower assembly comprises:

a lower horizontal support arm;

a contact point arm;

a contact; and a lower support arm fine positioning tab;

the upper support arm fine positioning tab is configured to be inserted into an upper guide plate slot such that the insertion movement is parallel to the upper assembly contact principal displacement direction;

the lower support arm fine positioning tab is configured to be inserted into a slot such that the insertion movement is parallel to the upper assembly contact principal displacement direction;

the insertion movement of the upper support arm fine positioning tab is in the same direction as the insertion movement of the lower support arm fine positioning tab;

the upper guide plate comprises the upper guide plate slot dimensioned for insertion of the upper support arm fine positioning tab;

the lower guide plate comprises a slot dimensioned for insertion of the lower support arm fine positioning tab;

the upper guide plate and the lower guide plate are substantially parallel to each other; and the spacer is configured to maintain a constant distance between the upper guide plate and the lower guide plate.

12. The socketed probe system of claim 11, wherein at least one of the upper assembly and the lower assembly further comprises a rough positioning tab.

13. The socketed probe system of claim 12, wherein the upper assembly comprises a rough positioning tab.

14. The socketed probe system of claim 13, wherein the rough positioning tab extends further from the upper horizontal support arm than the upper support arm fine positioning tab.

15. The socketed probe system of claim 11, wherein the upper support fine positioning tab comprises a spring arm.

16. The socketed probe system of claim 11, wherein the lower support arm fine positioning tab comprises a spring arm.

17. The socketed probe system of claim 11, wherein the upper assembly comprises a handling tab.

18. The socketed probe system of claim 11, wherein the lower assembly comprises a handling tab.

19. The socketed probe system of claim 11, wherein:

the lower horizontal support arm comprises a first lower support sub-arm and a second lower support sub-arm;

the first lower support sub-arm and the second lower support sub-arm are substantially parallel to each other; and one of the first lower support sub-arm and the second lower support sub-arm is substantially straight and the other of the first lower support sub-arm and the second lower support sub-arm is slightly curved.

20. The socketed probe system of claim 11, wherein:

the upper assembly comprises a rough positioning tab;

the rough positioning tab extends further from the upper horizontal support arm than the upper support arm fine positioning tab;

the upper support fine positioning tab comprises a spring arm;

the upper assembly comprises an upper handling tab;

the lower assembly comprises a lower handling tab;

the lower horizontal support arm comprises a first lower support sub-arm and a second lower support sub-arm;

the first lower support sub-arm and the second lower support sub-arm are substantially parallel to each other; and one of the first lower support sub-arm and the second lower support sub-arm is substantially straight and the other of the first lower support sub-arm and the second lower support sub-arm is slightly curved.

* * * * *